(12) United States Patent
Xu et al.

(10) Patent No.: US 12,737,073 B1
(45) **Date of Patent: *Sep. 15, 2026**

(54) DISPLAY PANEL AND DISPLAY DEVICE

(71) Applicant: BOE TECHNOLOGY GROUP CO., LTD., Beijing (CN)

(72) Inventors: Jingyi Xu, Beijing (CN); Jian Sun, Beijing (CN); Wei Yan, Beijing (CN); Zhenhong Xiao, Beijing (CN); Yadong Zhang, Beijing (CN); Zhen Wang, Beijing (CN); Peirong Huo, Beijing (CN); Hong Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

This patent is subject to a terminal disclaimer.

(21) Appl. No.: 19/214,708

(22) Filed: May 21, 2025

Related U.S. Application Data

(63) Continuation of application No. 18/017,572, filed as application No. PCT/CN2022/071014 on Jan. 10, 2022, now Pat. No. 12,340,046.

(30) Foreign Application Priority Data

Dec. 17, 2021 (WO) ................ PCT/CN2021/139269

(51) Int. Cl.
*G06F 3/041* (2006.01)
*H10D 86/40* (2025.01)
*H10D 86/60* (2025.01)

(52) U.S. Cl.
CPC ....... *G06F 3/04164* (2019.05); *H10D 86/441* (2025.01); *H10D 86/60* (2025.01)

(58) Field of Classification Search
None
See application file for complete search history.

(56) References Cited

U.S. PATENT DOCUMENTS 5,832,279 A * 11/1998 Rostoker ................. G06F 13/24 710/266
6,265,952 B1 * 7/2001 Kan ....................... H05K 1/025 361/767

(Continued)

FOREIGN PATENT DOCUMENTS

CN 102376275 A 3/2012
CN 105335003 A 2/2016

(Continued)

OTHER PUBLICATIONS

Office Action dated Sep. 5, 2025, issued in counterpart JP Application No. 2023-576402, with English translation. (5 pages).

*Primary Examiner* — Fred Tzeng
(74) *Attorney, Agent, or Firm* — WHDA, LLP

(57) ABSTRACT

A display panel includes an active area; a fanout region; and a bonding region located on one side of the fanout region away from the active area. A driver chip is disposed in the bonding region. The driver chip includes a first side edge adjacent to the fanout region, a second side edge opposite to the first side edge, and two third side edges. The driver chip includes a plurality of output terminals disposed close to the first side edge. The display panel includes: a plurality of fanout lines located in the fanout region; and a plurality of gull-wing lines located in the bonding region. Part of the fanout lines extend from the fanout region to a region where the first side edge is located, and are electrically connected to the output terminals. Another part of the fanout lines are electrically connected to the output terminals via the gull-wing lines.

19 Claims, 19 Drawing Sheets

(56) References Cited

U.S. PATENT DOCUMENTS 6,268,016 B1* 7/2001 Bhatt .................... H05K 3/181 29/830
6,433,767 B1 8/2002 Murade
8,008,665 B2* 8/2011 Yang .................... G02F 1/1345 438/149
9,795,031 B2* 10/2017 Song .................... H05K 1/0248
10,180,745 B2* 1/2019 Shao .................... G06F 3/0443
10,707,288 B2* 7/2020 Li .................... H10D 86/60
12,089,334 B2* 9/2024 Liu .................... H05K 1/028
12,340,046 B2* 6/2025 Xu .................... H10D 86/60
12,367,835 B2* 7/2025 Du .................... H10K 59/1216
12,453,258 B2* 10/2025 Han .................... H10D 86/00
2002/0093803 A1* 7/2002 Olzak .................... H05K 1/141 361/767
2007/0216845 A1* 9/2007 Liao .................... G02F 1/13452 349/149
2018/0157366 A1 6/2018 Du
2019/0280074 A1 9/2019 Li
2019/0361553 A1* 11/2019 Yin .................... H10D 86/441
2020/0027902 A1* 1/2020 Chien .................... H10D 86/443
2020/0185467 A1* 6/2020 Sun .................... H10K 59/131
2021/0091164 A1 3/2021 Kim et al.
2021/0183905 A1* 6/2021 Chen .................... H10K 59/124
2021/0333832 A1 10/2021 Wang et al.
2022/0077273 A1 3/2022 Qing et al.
2023/0157099 A1* 5/2023 Du .................... H10K 59/1216 257/91
2023/0165091 A1* 5/2023 Xu .................... H10K 59/1213 257/91
2023/0207572 A1* 6/2023 Ma .................... H10D 86/60 257/72
2024/0113133 A1* 4/2024 Wan .................... G02F 1/136286
2024/0272500 A1* 8/2024 Wan .................... G02F 1/136286

FOREIGN PATENT DOCUMENTS

CN 105653087 A 6/2016
CN 106873222 A 6/2017
CN 108400101 A 8/2018
CN 108777114 A 11/2018
CN 109634003 A 4/2019
CN 109658830 A 4/2019
CN 111708238 A 9/2020
CN 212181216 U 12/2020
CN 112838106 A 5/2021
CN 112946944 A 6/2021
CN 113436541 A 9/2021
CN 113487971 A 10/2021

* cited by examiner

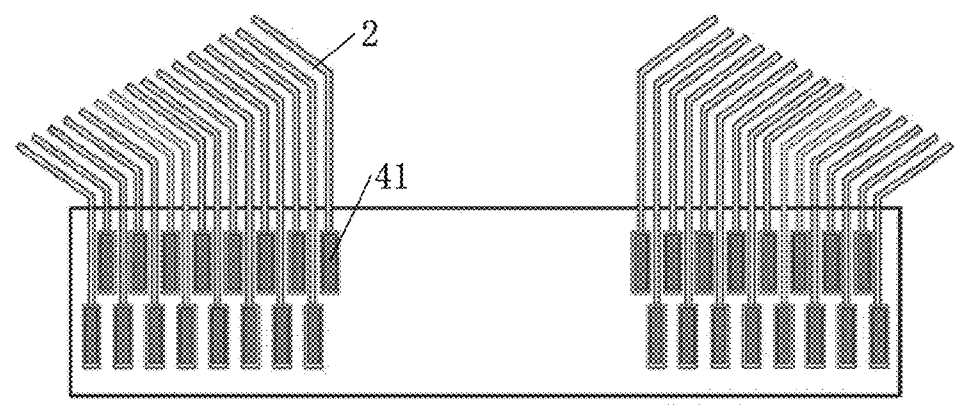
FIG. 20
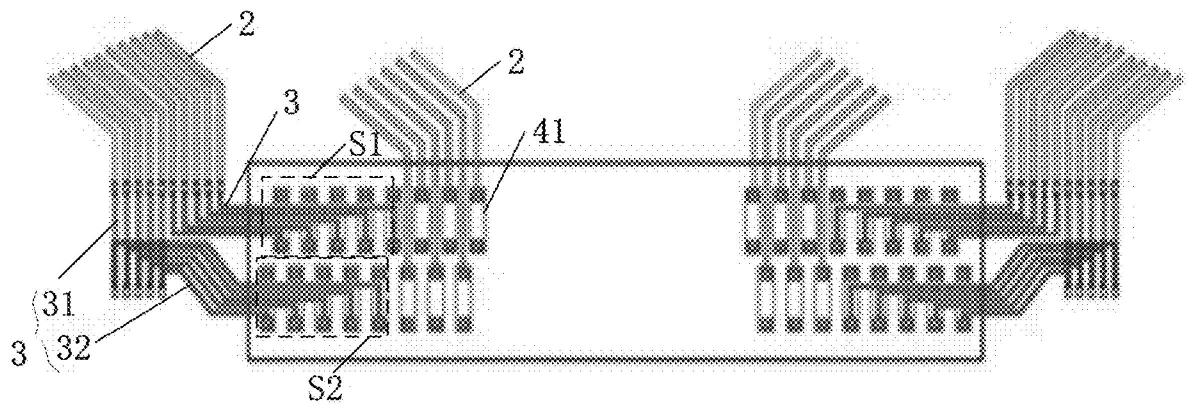
FIG. 21
A1
41
404
A2
FIG. 22

DISPLAY PANEL AND DISPLAY DEVICE

CROSS REFERENCE TO RELEVANT APPLICATIONS

This application is a continuation application of U.S. application Ser. No. 18/017,572, filed on Jan. 23, 2023, and which is a national stage application under 35 U.S.C. § 371 of International Application No. PCT/CN2022/071014, filed Jan. 10, 2022, the contents of which are incorporated herein by reference in its entirety.

TECHNICAL FIELD

The present application relates to the technical field of displaying and, more particularly, to a display panel and a display device.

BACKGROUND

With the rapid development of display technology, people have higher requirements for performance of display products. However, due to the limited design space of a fanout region of a current display product, fanout lines in the fanout region are very densely arranged, and the width of each of the fanout lines is small, which makes the resistances of the fanout lines larger and makes it difficult to achieve high-frequency charging of the display products.

At present, a novel display panel is urgently needed to solve the above problems.

SUMMARY

Embodiments of the present application use the following technical solutions.

In a first aspect, an embodiment of the present application provides a display panel. The display panel includes:

an active area;

a fanout region located on one side of the active area; and a bonding region located on one side of the fanout region away from the active area, a driver chip being disposed in the bonding region, the driver chip including a first side edge adjacent to the fanout region, a second side edge opposite to the first side edge, and two third side edges connecting the first side edge and the second side edge, the driver chip further including a plurality of output terminals disposed close to the first side edge; and the display panel further includes:

a plurality of fanout lines disposed in the fanout region; and a plurality of gull-wing lines located at least in the bonding region, wherein part of the fanout lines extend from the fanout region to a region where the first side edge is located, and are electrically connected to the output terminals; another part of the fanout lines are electrically connected to the output terminals via the gull-wing lines, and the gull-wing lines pass through a region where at least one of the first side edge, the two third side edges or the second side edge is located.

In some embodiments of the present application, the gull-wing lines pass through the region where the first side edge is located.

In some embodiments of the present application, the gull-wing lines pass through the region where the second side edge is located.

In some embodiments of the present application, part of the gull-wing lines pass through the region where the second side edge is located, and another part of the gull-wing lines pass through the region where at least one of the two third side edges is located.

In some embodiments of the present application, part of the gull-wing lines pass through the region where the first side edge is located, and another part of the gull-wing lines pass through the region where at least one of the two third side edges is located.

In some embodiments of the present application, the display panel further includes a plurality of receiving terminals; the receiving terminals are configured to be bound to the output terminals of the driver chip; orthographic projections of the receiving terminals on a substrate of the display panel overlap with orthographic projections of the output terminals on the substrate; part of the receiving terminals are electrically connected to the fanout lines passing through the region where the first side edge is located, and another part of the receiving terminals are electrically connected to the gull-wing lines; and orthographic projections of the gull-wing lines on the substrate overlap with orthographic projections of at least one of the receiving terminals electrically connected to the gull-wing lines on the substrate.

In some embodiments of the present application, the receiving terminals electrically connected to the gull-wing lines are divided into a first group arranged along the first side edge, and a second group arranged along the second side edge; gull-wing lines electrically connected to the first group of receiving terminals are arranged in a same layer, gull-wing lines electrically connected to the second group of receiving terminals include first gull-wing lines and second gull-wing lines, and the first gull-wing lines and the second gull-wing lines are located in different layers; and the gull-wing lines electrically connected to the first group of receiving terminals are disposed in the same layer as the second gull-wing lines of the gull-wing lines electrically connected to the second group of receiving terminals.

In some embodiments of the present application, the receiving terminals electrically connected to the gull-wing lines include:

a gate layer, being disposed on the substrate and including two conductive pads disposed independently and oppositely;

a dielectric layer, covering the gate layer and exposing partial regions of the conductive pads;

a source-drain metal layer, covering the dielectric layer and being in direct contact with the exposed partial regions of the conductive pads; and an electrode layer, covering the source-drain metal layer and being configured to be in direct contact with the output terminals of the driver chip.

In some embodiments of the present application, the gull-wing lines electrically connected to the first group of receiving terminals and the second gull-wing lines of the gull-wing lines electrically connected to the second group of receiving terminals are located in the gate layer, and pass through a region between the two conductive pads of the receiving terminals.

In some embodiments of the present application, for one of the first group of receiving terminals, a gull-wing line is electrically connected to conductive pads of the receiving terminal, and orthographic projections of other gull-wing lines electrically connected to the first group of receiving terminals on the substrate do not overlap with orthographic projections of the conductive pads of the receiving terminal on the substrate; and for one of the second group of receiving terminals, one second gull-wing line is electrically connected to conductive pads of the receiving terminal, and orthographic projections of other second gull-wing lines electrically connected to the second group of receiving terminals on the substrate do not overlap with orthographic projections of the conductive pads of the receiving terminal on the substrate.

In some embodiments of the present application, the display panel further includes a plurality of spare receiving terminals, and the spare receiving terminals are of the same structure as the receiving terminals;

spare receiving terminals disposed in the same row as the first group of receiving terminals are first spare receiving terminals, and spare receiving terminals disposed in the same row as the second group of receiving terminals are second spare receiving terminals; and at least part of the gull-wing lines electrically connected to the first group of receiving terminals pass through a region between two conductive pads in the first spare receiving terminals, and at least part of the gull-wing lines electrically connected to the second group of receiving terminals pass through a region between two conductive pads in the second spare receiving terminals.

In some embodiments of the present application, the fanout lines include display fanout lines and touch fanout lines;

the touch fanout lines extend from the fanout region to the region where the first side edge is located, and are electrically connected to the output terminals; and part of the display fanout lines are electrically connected to the output terminals via the gull-wing lines.

In some embodiments of the present application, the gull-wing lines include display gull-wing lines and touch gull-wing lines; the fanout lines include display fanout lines and touch fanout lines; and part of the display fanout lines are electrically connected to the output terminals via the display gull-wing lines, and part of the touch fanout lines are electrically connected to the output terminals via the touch gull-wing lines.

In some embodiments of the present application, the gull-wing lines are located in the same layer.

In some embodiments of the present application, part of the gull-wing lines are disposed in the same layer, another part of the gull-wing lines include first gull-wing lines and second gull-wing lines, and the first gull-wing lines and the second gull-wing lines are located in different layers; and the gull-wing lines disposed in the same layer extend from the bonding region to the fanout region, and each of the gull-wing lines includes a first line segment, a second line segment, a third line segment, a fourth line segment, and a fifth line segment connected in sequence, wherein the first line segment and the second line segment are located in the bonding region, the third line segment extends from the bonding region to the fanout region, and the fourth line segment and the fifth line segment are located in the fanout region; and the first line segment is electrically connected to the fanout lines, and the fifth line segment is electrically connected to the output terminals.

In some embodiments of the present application, the gull-wing lines include first gull-wing lines and second gull-wing lines, and the first gull-wing lines and the second gull-wing lines are located in different layers;

the first gull-wing lines extend in a first direction, and the second gull-wing lines include first line segments extending in a second direction; the first gull-wing lines are electrically connected to the fanout lines and the first line segments; the first direction is a direction that the active area points to the bonding region, and the second direction is parallel to the first direction; and orthographic projections of the first line segments on a substrate of the display panel overlap with orthographic projections of the first gull-wing lines electrically connected to the first line segments on the substrate.

In some embodiments of the present application, the second gull-wing lines further include second line segments and third line segments, the second line segments extend in a third direction, the first line segments, the second line segments and the third line segments are connected in sequence, and the third line segments are electrically connected to the output terminals; the third direction intersects the first direction; and the first gull-wing lines, the first line segments, and the third line segments are arranged in the same order in the third direction.

In some embodiments of the present application, an angle between an extension line of the first line segment and an extension line of the second line segment is a right angle, and an angle between the extension line of the second line segment and an extension line of the third line segment is a right angle; or the angle between the extension line of the first line segment and the extension line of the second line segment is an obtuse angle, the angle between the extension line of the second line segment and the extension line of the third line segment is an obtuse angle, and the two obtuse angles are the same; or one of the angle between the extension line of the first line segment and the extension line of the second line segment and the angle between the extension line of the second line segment and the extension line of the third line segment is a right angle, and the other is an obtuse angle.

In some embodiments of the present application, first corners are disposed between the first line segment and the second line segment, and second corners are disposed between the second line segment and the third line segment; and at least part of the first corners and/or the second corners are rounded corners.

In some embodiments of the present application, at least one island pattern is disposed between every two adjacent first corners, and the island patterns between every two adjacent first corners are not connected; and/or at least one island pattern is disposed between every two adjacent second corners, and the island patterns between every two adjacent second corners are not connected.

In some embodiments of the present application, part of the second gull-wing lines are located in the same layer, another part of the second gull-wing lines are located in the same layer, and the two parts of the second gull-wing lines are located in different layers;

in the third direction, every two of the first line segments fall into a set, and each first line segment line set includes an outer first line segment and an inner first line segment arranged in the third direction; and for each first line segment line set, an orthographic projection of a second line segment electrically connected to the outer first line segment on the substrate overlaps with an orthographic projection of a second line segment electrically connected to the inner first line segment on the substrate.

In some embodiments of the present application, the display panel includes a test unit and a plurality of test connection lines;

the test unit is located on a side, away from the active area, of a region where the output terminals are located; the test connection lines are configured to connect the test unit and the output terminals; and the output terminals electrically connected to the gull-wing lines are further electrically connected to the test connection lines directly.

In some embodiments of the present application, wherein orthographic projections of a gull-wing line and a test connection line electrically connected to the same output terminal on the substrate partially overlap.

In some embodiments of the present application, the display panel includes test units, and the test units are divided into a display test unit and a touch test unit; and at least one of the display test unit and the touch test unit is located on a side, away from the fanout region, of the active area, and the other is located in the fanout region or the bonding region.

In some embodiments of the present application, a region of the side, away from the fanout region, of the active area includes a central region and two corner regions located on two sides of the central region; the display test unit and the touch test unit each include a plurality of test subunits, and projections of the test subunits on the substrate are in shapes of rectangles;

test subunits of the corner regions are disposed around an edge of the active area; and long sides of rectangles of the corner regions are parallel, or an angle with a preset angle exists between long sides of two adjacent rectangles of the corner regions.

In some embodiments of the present application, the display panel includes a plurality of first signal conditioning lines, and the first signal conditioning lines are located between the fanout lines and the gull-wing lines;

in a third direction, the fanout lines and the gull-wing lines are arranged in different orders; ends, connected to the fanout lines, of the first signal conditioning lines are arranged in the same order as the fanout lines, and ends, connected to the gull-wing lines, of the first signal conditioning lines are arranged in the same order as the gull-wing lines; and the third direction intersects the first direction.

In some embodiments of the present application, the display panel includes a plurality of second signal conditioning lines, and the second signal conditioning lines are disposed between fanout lines that pass through the region where the first side edge is located to be electrically connected to the output terminals and the output terminals;

in a third direction, the fanout lines and the output terminals are arranged in different orders; ends, connected to the fanout lines, of the second signal conditioning lines are arranged in the same order as the fanout lines, and ends, connected to the output terminals, of the second signal conditioning lines are arranged in the same order as the output terminals; and the third direction intersects the first direction.

In some embodiments of the present application, at least part of line segments of the first gull-wing lines are of a serpentine structure.

In some embodiments of the present application, part of the fanout lines are made of first conductive material, another part of the fanout lines are made of second conductive material, and resistance of the first conductive material is greater than resistance of the second conductive material;

part of the fanout lines made of the first conductive material are electrically connected to the first gull-wing lines, and part of the fanout lines made of the second conductive material are electrically connected to the first gull-wing lines; and the first gull-wing lines electrically connected to the fanout lines made of the first conductive material are of a serpentine structure.

In some embodiments of the present application, the driver chip further includes a plurality of input terminals, and the input terminals are arranged in an extension direction of the second side edge; and orthographic projections of the gull-wing lines on a substrate of the display panel do not overlap with orthographic projections of the input terminals on the substrate.

In some embodiments of the present application, the fanout lines include first fanout segments and second fanout segments connected to the first fanout segments, the first fanout segments are electrically connected to signal lines of the active area, and the second fanout segments are electrically connected to the output terminals;

a preset angle exists between the second fanout segments and an edge, close to the fanout region, of the active area; and a sine value of the preset angle is equal to a ratio of a width of a region occupied by all the second fanout segments in a direction perpendicular to an extension direction of the second fanout segments to half of a width of the active area in a direction parallel to the first side edge.

In a second aspect, an embodiment of the present application provides a display device including the above-mentioned display panel.

The above description is merely an overview of the technical solution of the present application, which can be implemented according to the contents of the specification in order to enable the technical means of the present application to be more clearly understood, and in order to enable the above and other objects, features and advantages of the present application to be more clearly understood, specific implementations of the present application are set forth below.

BRIEF DESCRIPTION OF THE DRAWINGS

For clearer descriptions of the technical solutions according to the embodiments of the present application or in the related art, drawings that are to be referred for description of the embodiments or the prior art are briefly described hereinafter. Apparently, the drawings described hereinafter merely illustrate some embodiments of the present application. Persons of ordinary skill in the art may also derive other drawings based on the drawings described herein without any creative effort.

FIG. 20 is a schematic structural diagram of a display panel in another related art according to an embodiment of the present application;

FIG. 21 is a schematic structural diagram of another display panel according to an embodiment of the present application;

FIG. 22 is a schematic structural diagram of a receiving terminal in FIG. 20;

DETAILED DESCRIPTION OF THE EMBODIMENTS

The technical solutions according to the embodiments of the present application will be clearly and completely described below with reference to the drawings according to the embodiments of the present application. Apparently, the embodiments described hereinafter are merely a part of the embodiments of the present application, rather than all the embodiments. Based on the embodiments of the present application, all other embodiments obtained by those of ordinary skill in the art without making creative work shall fall within the protection scope of the present application.

Unless the context requires otherwise, throughout the specification and the claims, the term "comprise" is to be construed in an open, inclusive sense, that is, "including, but not limited to". In the description of the specification, the terms "one embodiment", "some embodiments", "exemplary embodiments", "examples", "particular examples", or "some examples", etc. are intended to indicate that a particular feature, structure, material, or characteristic described in connection with the embodiment or example is included in at least one embodiment or example of the present application. The schematic representations of the above terms do not necessarily refer to the same embodiment or example. Furthermore, the particular features, structures, material, or characteristics described may be included in any suitable manner in any one or more embodiments or examples.

In the embodiments of the present application, the words "first", "second" and the like are used to partially describe the same or similar items having substantially the same functions and functions, merely to clearly describe the technical solutions of the embodiments of the present application, and thus should not be interpreted as indicating or implying relative importance or implicitly indicating the number of technical features indicated.

Figure 1:
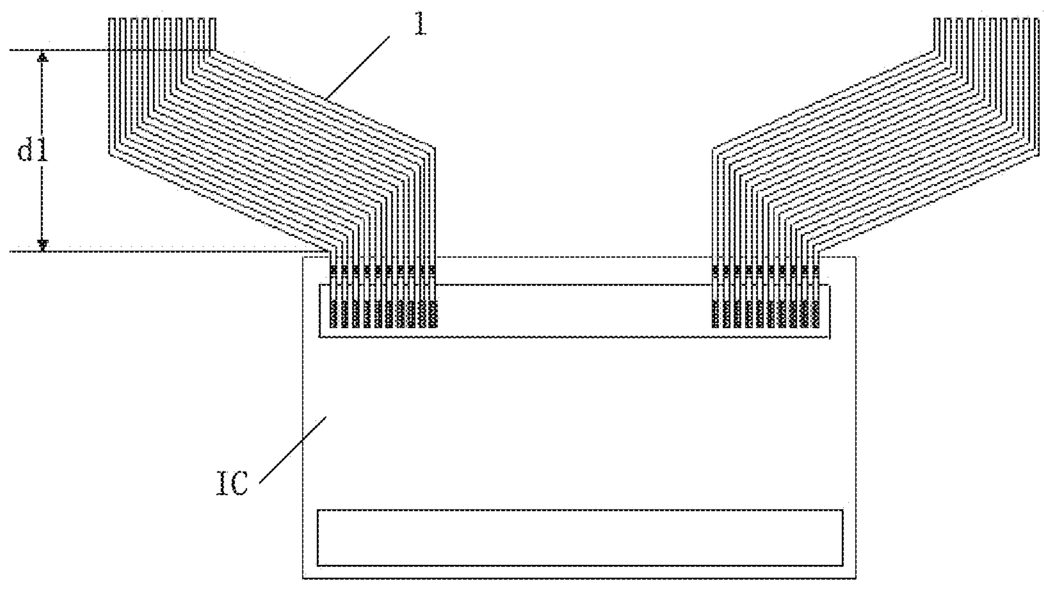
FIG. 1 is a schematic structural diagram of a display panel in the related art.

In the related art, as shown in FIG. 1, a fanout region of a display panel is densely provided with driving signal lines 1 (also referred to as fanout lines), which greatly reduces the design space of the fanout region. In addition, since the width of each of the driving signal lines 1 is narrow, the resistances of the driving signal lines 1 are high, and it is difficult to achieve high-frequency charging of a display product.

Figure 2:
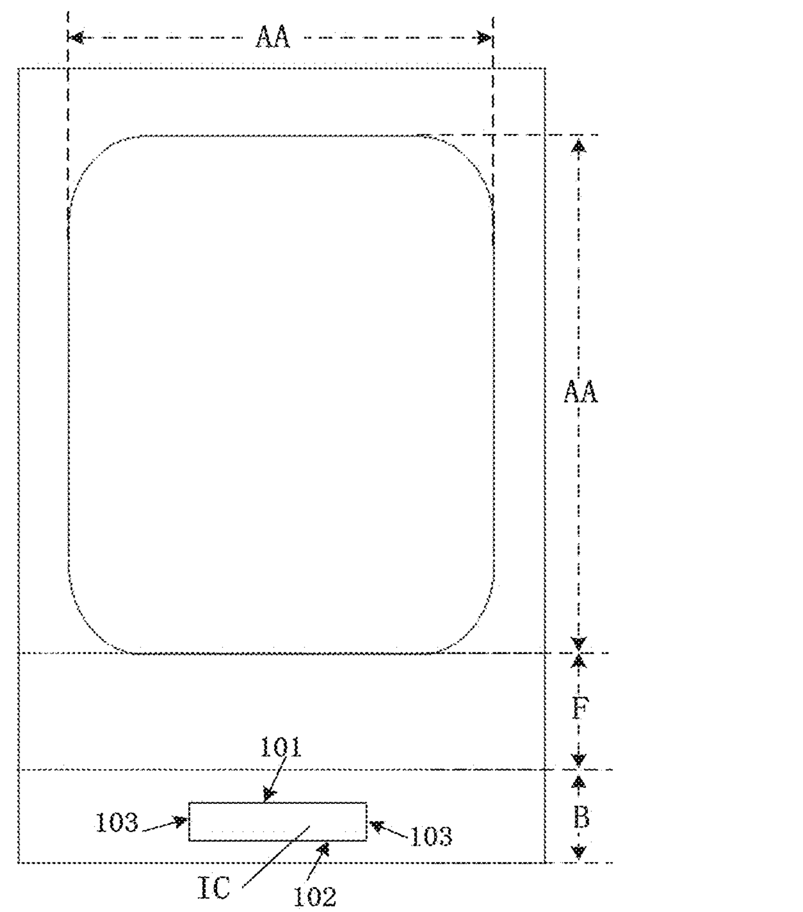
FIG. 2 to FIG. 6 and FIG. 10 are schematic structural diagrams of six different display panels according to embodiments of the present application.
Figures 3, 4:
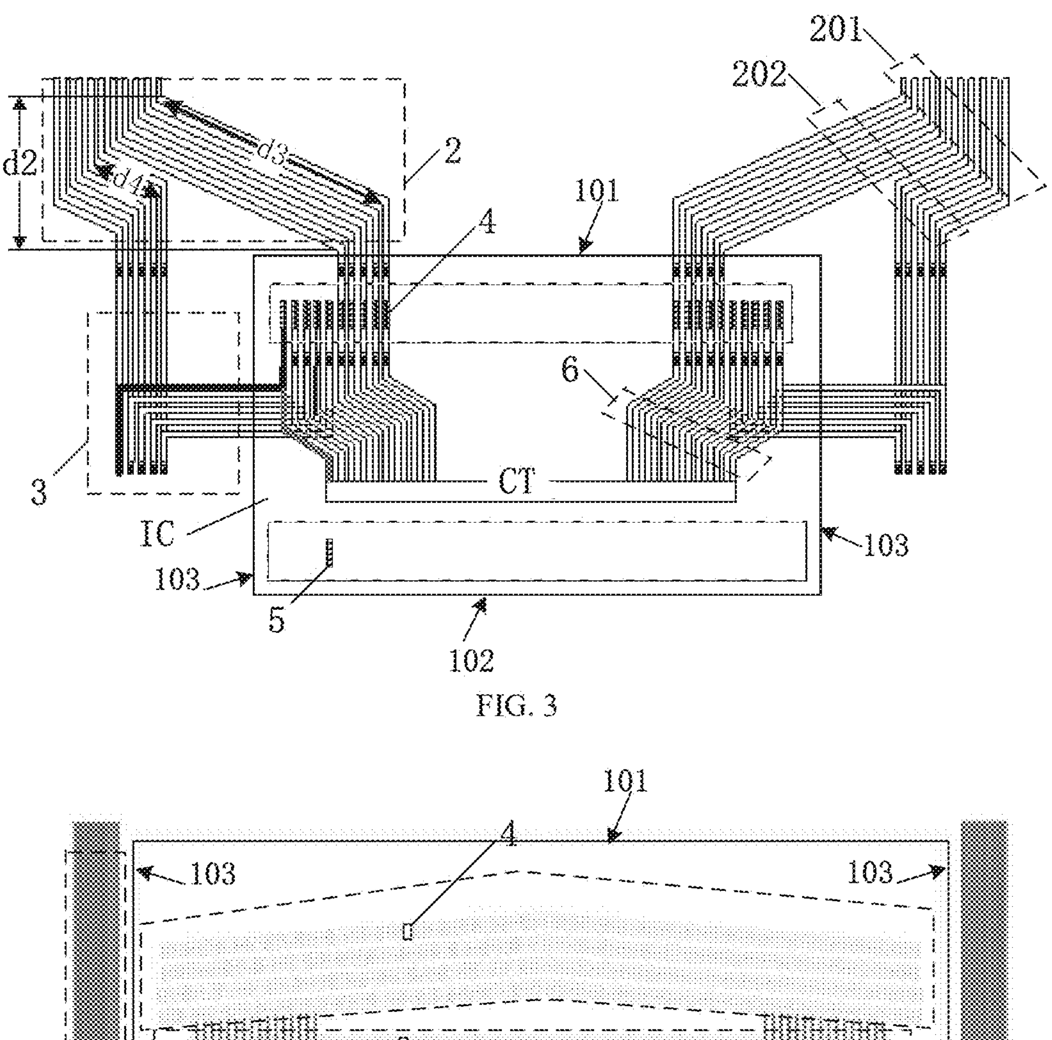

Based on this, an embodiment of the present application provides a display panel. As shown in FIG. 2 and FIG. 3, the display panel includes:

- an active area AA;
- a fanout region F located on one side of the active area AA; and
- a bonding region B located on one side of the fanout region F away from the active area AA. A driver chip IC is disposed in the bonding region B. The driver chip IC includes a first side edge 101 adjacent to the fanout region F, a second side edge 102 opposite to the first side edge 101, and two third side edges 103 connecting the first side edge 101 and the second side edge 102. The driver chip IC further includes a plurality of output terminals 4 disposed close to the first side edge 101.

The display panel includes:

- a plurality of fanout lines 2 disposed in the fanout region F; and
- a plurality of gull-wing lines 3 located at least in the bonding region B.

Part of the fanout lines 2 extend from the fanout region F to a region where the first side edge 101 is located, and are electrically connected to the output terminals 4. Another part of the fanout lines 2 are electrically connected to the output terminals 4 via the gull-wing lines 3, and the gull-wing lines 3 pass through a region where at least one of the first side edge 101, the two third side edges 103 or the second side edge 102 is located.

It should be noted that the description of "part of the fanout lines and another part of the fanout lines" according to the embodiment of the present application refers to two different parts of fanout lines, but the fanout lines according to the embodiment of the present application include and are not limited to the two parts, and may further include other parts of fanout lines. The description of "part, and another part," "a part, and another part" hereinafter is similar in meaning to that herein, which will not be repeated.

In an exemplary embodiment, part of the fanout lines 2 being electrically connected to the output terminals 4 via the gull-wing lines 3 may be understood as: the gull-wing lines 3 are located between the fanout lines 2 and the output terminals 4, and the gull-wing lines 3 are located at least in the bonding region B.

That the plurality of gull-wing lines 3 are located at least in the bonding region B indicates that each gull-wing line 3 is located in the bonding region B; or, part of the gull-wing lines 3 are located in the bonding region B, and another part of the gull-wing lines 3 may extend from the bonding region B to the fanout region F; or, part of line segments of the gull-wing lines 3 are located in the bonding region B, and another part of line segments of the gull-wing lines are located in the fanout region F.

Exemplarily, referring to FIG. 3, the gull-wing lines 3 are located in the bonding region B, and part of the fanout lines 2 are electrically connected to the corresponding output terminals by winding the gull-wing lines 3 in the bonding region B.

Figure 18:
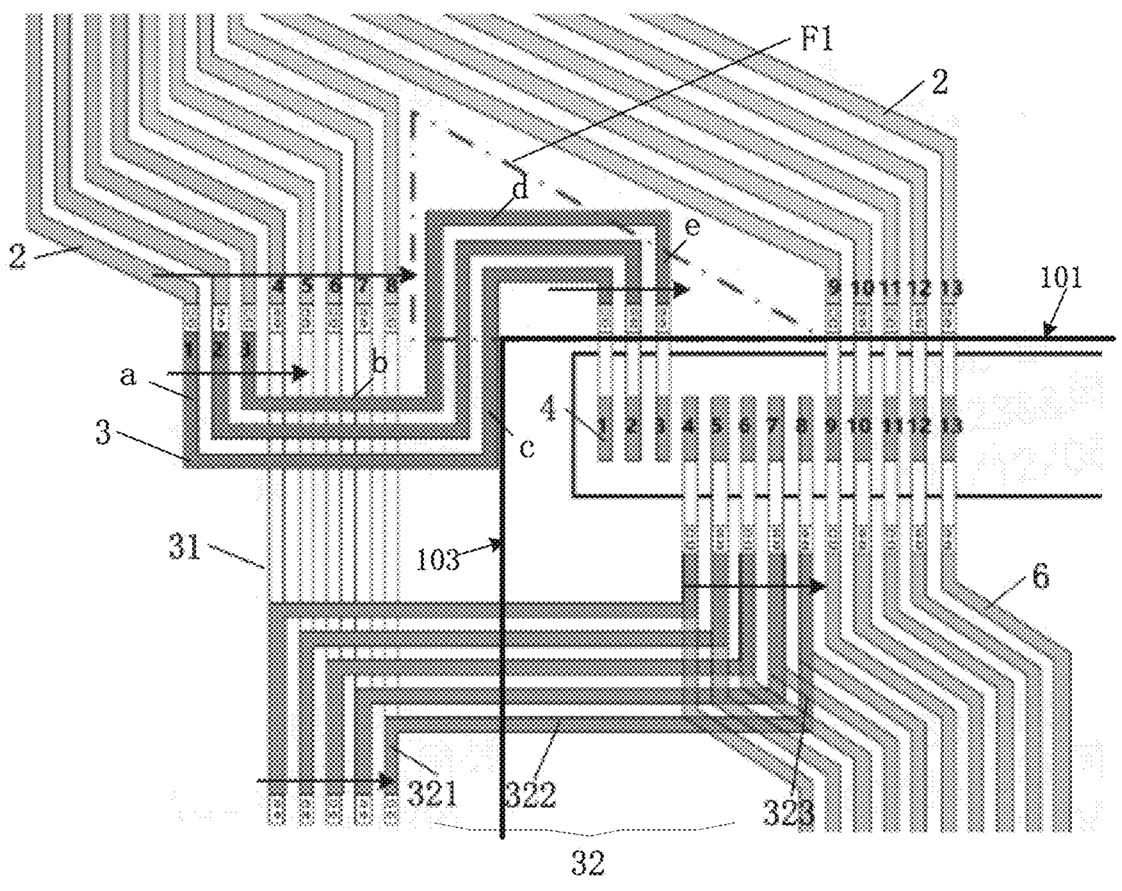
FIG. 18 is a schematic structural diagram of a bonding region and a fanout region of a display panel according to an embodiment of the present application.

Exemplarily, referring to FIG. 18, part of line segments of the gull-wing lines 3 are located in the bonding region B, and another part of line segments of the gull-wing lines 3 are located in the fanout region F. It can be understood that the gull-wing line 3 extends from the bonding region B to the fanout region F, and part of the fanout lines 2 are electrically connected to the corresponding output terminals 4 by enabling the gull-wing lines 3 to wind from the bonding region B to the fanout region F and then pass through a region where the first side edge 101 is located.

The specific type of the above driver chip IC is not limited herein. Exemplarily, the above driver chip may be a display driver chip; or, the above driver chip may also be a TDDI chip.

The specific type of the above fanout lines 2 is not limited herein. Exemplarily, the above fanout lines 2 may include display fanout lines (also referred to as display driver lines or source driver lines); or, the above fanout lines 2 may include touch fanout lines; or, the above fanout lines 2 include display fanout lines and touch fanout lines at the same time.

When the above display panel is a touch and display driver integration display panel (TDDI display panel), the above fanout lines include display fanout lines and touch fanout lines at the same time.

In an exemplary embodiment, part of the display fanout lines may be set to be electrically connected to the output terminals 4 via the gull-wing lines 3, and the gull-wing lines 3 pass through the region where at least one of the first side edge 101, the two third side edges 103 and the second side edge 102 is located; and the touch fanout lines and another part of the display fanout lines extend from the fanout region F to the region where the first side edge 101 is located, and are electrically connected to the output terminals 4.

Or, part of the touch fanout lines may be set to be electrically connected to the output terminals 4 via the gull-wing lines 3, and the gull-wing lines 3 pass through the region where at least one of the first side edge 101, the two third side edges 103, and the second side edge 102 is located; and the display fanout lines and another part of the touch fanout lines extend from the fanout region F to the region where the first side edge 101 is located, and are electrically connected to the output terminals 4.

Or, part of the touch fanout lines and part of the display fanout lines may be set to be electrically connected to the output terminals 4 via the gull-wing lines 3, and the gull-wing lines 3 pass through the region where at least one of the first side edge 101, the two third side edges 103 and the second side edge 102 is located; and another part of the display fanout lines and another part of the touch fanout lines extend from the fanout region F to the region where the first side edge 101 is located, and are electrically connected to the output terminals 4.

Figure 5:
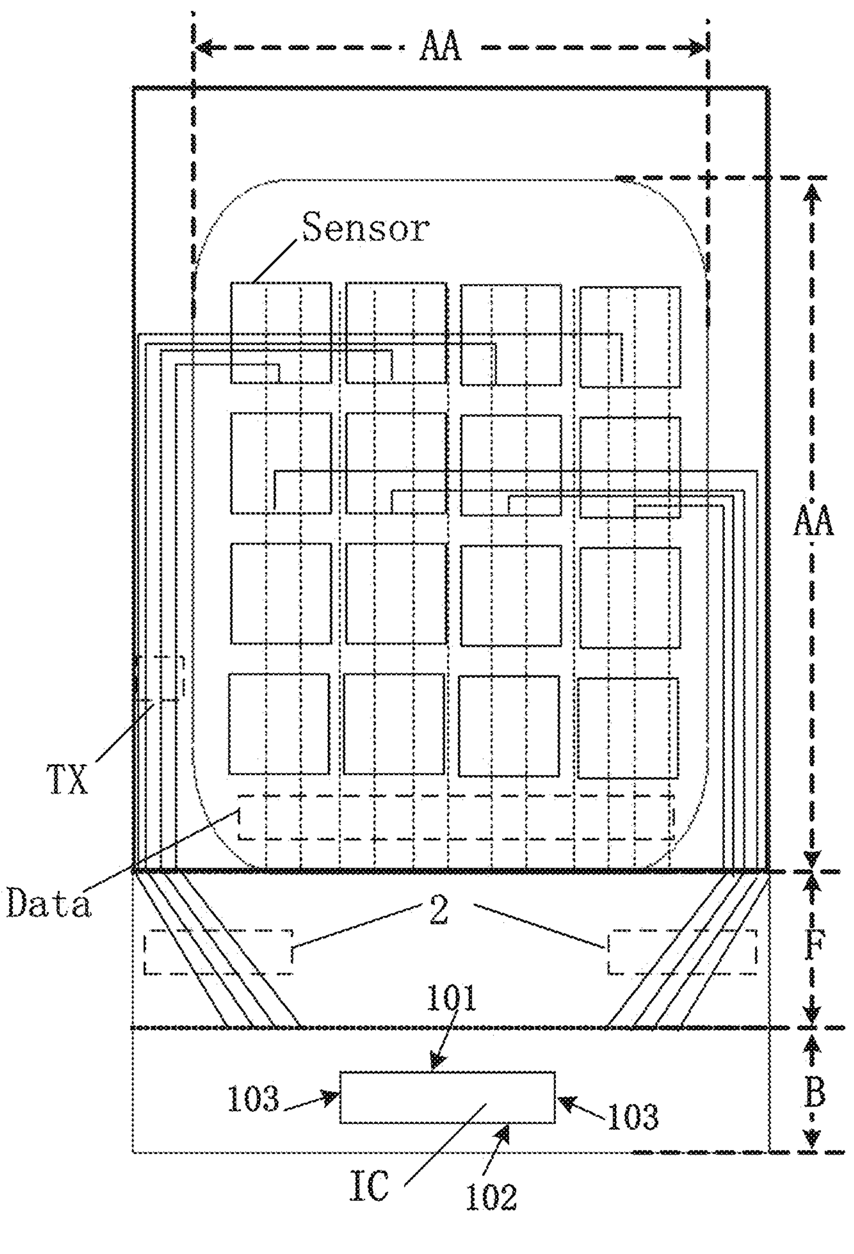

In an exemplary embodiment, referring to FIG. 5, the display panel includes touch sensors implementing a touch function, a plurality of touch electrode lines TX connecting the touch sensors and the touch fanout lines, and a plurality of data signal lines Data connecting pixel units and the display fanout lines.

When the touch electrode lines TX are located on two sides of the active area AA and the data signal lines Data are located in the active area AA, display fanout lines (not drawn in FIG. 5) electrically connected to the data signal lines Data may be set in a middle region of the fanout region F, and touch fanout lines electrically connected to the touch electrode lines TX may be set on two sides of the display fanout lines. The touch fanout lines are drawn in the fanout region F shown in FIG. 5. In this case, the display fanout lines electrically connected to the data signal lines Data may extend from the fanout region F to the region where the first side edge 101 is located, and are electrically connected to the output terminals 4, and the touch fanout lines electrically connected to the touch electrode lines TX may be electrically connected to the output terminals 4 via the gull-wing lines 3.

When the touch electrode lines TX and the data signal lines Data are located in the active area AA, the touch electrode lines TX and the data signal lines Data have the same extension direction and arrangement direction, and are arranged alternately. Exemplarily, the touch electrode lines TX and the data signal lines Data may be arranged alternately in an order of two touch electrode lines TX and one data signal line Data, or, in other manners. In this case, the touch fanout lines electrically connected to the touch electrode lines TX and the display fanout lines electrically connected to the data signal lines Data in the fanout region F may also be arranged alternately. As a result, part of the display fanout lines may be set to extend directly from the fanout region F to the region where the first side edge 101 is located, and be electrically connected to the output terminals 4, and another part of the display fanout lines are electrically connected to the output terminals 4 via the gull-wing lines 3; and part of the touch fanout lines may be set to extend from the fanout region F to the region where the first side edge 101 is located, and be electrically connected to the output terminals 4, and another part of the touch fanout lines are electrically connected to the output terminals 4 via the gull-wing lines 3.

Figure 15:
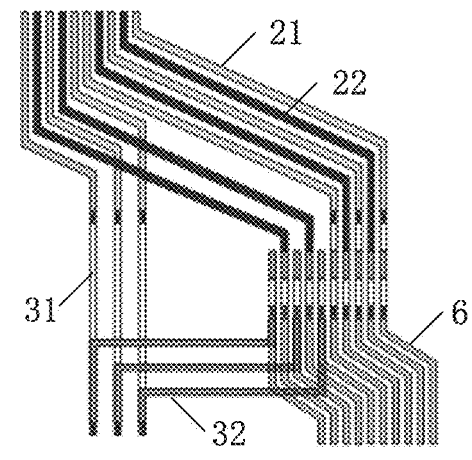
FIG. 15 is a schematic structural diagram of gull-wing lines of a display panel of touch and display driver integration technology according to an embodiment of the present application.

Certainly, referring to FIG. 15, all the touch fanout lines 22 may be set to extend from the fanout region F to the region where the first side edge 101 is located, and be electrically connected to the output terminals 4; and part of the display fanout lines 21 may be set to be electrically connected to the output terminals 4 via the gull-wing lines 3 (first gull-wing lines 31 and second gull-wing lines 32).

The above-mentioned display panel may be any one of a liquid crystal display (LCD) display panel, an organic light emitting diode (OLED) display panel, a Mini LED display panel, or a Micro LED display panel.

The size of the above-mentioned display panel is not limited. The display panel may be applied to a large or ultra large size (for example, 86 inches) ultra high definition (UHD) display device or high definition (HD) display device, or, may be applied to a small size (for example, 23.6 inches) UHD display device or HD display device.

The above-mentioned display panel may be a display panel of non-TDDI technology, or, may be a display panel of TDDI technology.

Exemplarily, the display panel of TDDI technology may be divided into an advanced super dimension switch (ADS) type LCD touch display or an HADS type LCD touch display. The specific type of the display panel is not limited herein.

In practical application, for the display panel of non-TDDI technology, the driver chip IC is a display driver chip, and driving signal lines 1 are display driver lines (Source lines). The display driver lines may transmit a display driving signal output from the display driver chip to the data signal lines Data in the display panel, so as to control the displaying of each pixel unit in the active area.

For the display panel of TDDI technology, the driver chip IC is a TDDI chip, and driving signal lines 1 include display driver lines and touch driver lines, and the display driver lines may transmit a display driving signal output from the TDDI chip to the data signal lines Data in the display panel, so as to control the displaying of each pixel unit in the active area; the touch driver lines may transmit a touch driving signal output from the TDDI chip to the touch electrode lines TX in the display panel, so as to control the touch sensors to implement the touch function.

Since the fanout region of the display panel of TDDI technology has not merely display driver lines but also touch driver lines, for the display panel of TDDI technology, the design space of the fanout region is more limited, and high-frequency charging is more difficult to realize.

However, in the display panel according to the embodiment of the present application, the plurality of gull-wing lines 3 are disposed in the bonding region B, and by winding the gull-wing lines 3 (including winding from an upper side, left and right sides and a lower side of the driver chip), part of the fanout lines 2 are electrically connected to the output terminals 4 of the driver chip via the gull-wing lines 3, thus utilizing a region, without the driver chip, in the bonding region B, shortening the length of the fanout lines 2 electrically connected to the gull-wing lines 3, and greatly reducing the occupied space of the fanout lines 2 in the fanout region F. In practical application, by increasing the line width of the fanout lines 2 and a distance between every two adjacent fanout lines 2, the resistance of the fanout lines 2 can be greatly reduced, thus realizing high-frequency charging of the pixel units in the active area AA, improving the charging efficiency of the display panel, shortening the charging time, and reducing the power consumption of the display panel.

In addition, in practical application, as shown in FIG. 1 and FIG. 3, since part of the fanout lines 2 are electrically connected to the output terminals 4 of the driver chip by winding the gull-wing lines 3, the region, without the driver chip, in the bonding region B is utilized, the length of the fanout lines 2 electrically connected to the gull-wing lines 3 is shortened, and thus a size d2 of the fanout region F in a direction that the active area AA points to the fanout region F is reduced, and compared with a size d1 of the fanout region F in the direction that the active area AA points to the fanout region F, d2 may be 0.1 mm-0.2 mm less than d1, which is conducive to the preparation of display panels with narrow bezels.

In an exemplary embodiment, referring to FIG. 18, the gull-wing lines 3 pass through the region where the first side edge 101 is located.

In practical application, when winding the gull-wing lines 3, a certain design space is released between the fanout lines 2 electrically connected to the gull-wing lines 3 and fanout lines 2 not electrically connected to the gull-wing lines 3. The gull-wing lines 3 may extend from the bonding region B to the fanout region F, and wind from the region where the first side edge 101 is located, such that this part of the fanout lines 2 are electrically connected to the output terminals 4 via the gull-wing lines 3. Since the space of the region where the first side edge 101 is located is limited, a small number of gull-wing lines 3 may be set to pass through the region where the first side edge 101 is located, and be electrically connected to the output terminals 4 according to the situation, such that the design space occupied by the fanout lines 2 in the fanout region F may be reduced to a certain extent.

It should be noted that in FIG. 18, part of the gull-wing lines 3 pass through the region where the first side edge 101 is located, and part of the gull-wing lines 3 pass through the region where the third side edge 103 is located.

In an exemplary embodiment, referring to FIG. 4, the gull-wing lines 3 pass through the region where the second side edge 102 of the driver chip IC is located.

In practical application, a circuit board is disposed between the second side edge 102 of the driver chip IC and an edge of the display panel, and the gull-wing lines 3 may pass through a region between the second side edge 102 and the circuit board, and then pass through the region where the second side edge 102 is located to be electrically connected to the output terminals 4 of the driver chip.

In an exemplary embodiment, part of the gull-wing lines 3 pass through the region where the second side edge 102 of the driver chip IC is located, and another part of the gull-wing lines 3 pass through the region where at least one of the two third side edges 103 of the driver chip IC is located.

In an exemplary embodiment, referring to FIG. 3, the gull-wing lines 3 passes through the region where at least one of the two third side edges 103 of the driver chip IC is located.

In practical application, since the design space of the two sides (103) of the driver chip IC and the lower side of the driver chip IC in the bonding region B is relatively sufficient, the gull-wing lines 3 may be set to wind from regions on the two sides (103) and the lower side (102) of the driver chip IC.

Exemplarily, in the case where the gull-wing lines 3 pass through the region where at least one of the two third side edges 103 of the driver chip IC is located, the number of the gull-wing lines 3 (i.e., the number of fanout lines 2 to be wound) is related to the minimum distance between a region where the output terminals 4 of the driver chip are located and a region where input terminals 5 of the driver chip are located, the line width of the gull-wing lines 3, and a spacing between every two adjacent gull-wing lines 3. For example, the sum (pitch) of the line width of the gull-wing lines 3 and the spacing between every two adjacent gull-wing lines 3 is 4.0 μm, and the minimum distance between the region where the output terminals 4 of the driver chip are located and the region where the input terminals 5 of the driver chip are located is 400 μm, such that 100 gull-wing lines 3 may be provided, that is, 100 fanout lines 2 may be wound. In practical application, the number of fanout lines 2 to be wound may be determined according to the situation, which is not limited herein.

In an exemplary embodiment, referring to FIG. 18, part of the gull-wing lines 3 pass through the region where the first side edge 101 is located, and another part of the gull-wing lines 3 pass through the region where at least one of the two third side edges 103 is located.

In practical application, since part of the fanout lines 2 are electrically connected to the output terminals 4 of the driver chip after the gull-wing lines 3 wind from the bonding region B, an available space F1 exists between the fanout lines 2 electrically connected to the gull-wing lines 3 and the fanout lines 2 not electrically connected to the gull-wing lines 3 in the fanout region F, such that the gull-wing lines 3 extend from the bonding region B to the region marked as F1 in FIG. 18, then pass through the region where the first side edge 101 of the driver chip is located, and are electrically connected to the output terminals 4. In addition, by setting another part of the gull-wing lines 3 to pass through the region where at least one of the two third side edges 103 is located, the number of the fanout lines 2 that are electrically connected to the output terminals 4 via the gull-wing lines 3 can be greatly increased, thereby releasing the design space of the fanout region F. In practical application, by increasing the line width of the fanout lines 2 and the distance between every two adjacent fanout lines 2, the resistance of the fanout lines 2 can be greatly reduced, thus realizing high-frequency charging of the pixel units in the active area AA, improving the charging efficiency of the display panel, shortening the charging time, and reducing the power consumption of the display panel.

In some embodiments of the present application, referring to FIG. 21, the display panel further includes a plurality of receiving terminals 41. The receiving terminals 41 are configured to be bound to the output terminals 4 of the driver chip. Orthographic projections of the receiving terminals 41 on a substrate of the display panel overlap with orthographic projections of the output terminals 4 on the substrate. Part of the receiving terminals 41 are electrically connected to the fanout lines 2 passing through the region where the first side edge 101 is located, and another part of the receiving terminals 41 are electrically connected to the gull-wing lines 3.

Orthographic projections of the gull-wing lines 3 on the substrate overlap with orthographic projections of at least one of the receiving terminals 41 electrically connected to the gull-wing lines 3 on the substrate.

In an exemplary embodiment, that the orthographic projections of the receiving terminals 41 on the substrate of the display panel overlap with the orthographic projections of the output terminals 4 on the substrate indicates that orthographic projections of outer contours of the receiving terminals 41 on the substrate of the display panel and orthographic projections of outer contours of the output terminals 4 on the substrate have overlapping regions; or, the orthographic projections of the outer contours of the receiving terminals 41 on the substrate of the display panel completely overlap with the orthographic projections of the outer contours of the output terminals 4 on the substrate.

In the drawings according to the embodiment of the present application, the orthographic projections of the outer contours of the receiving terminals 41 on the substrate of the display panel completely overlap with the orthographic projections of the outer contours of the output terminals 4 on the substrate. As a result, in the drawings with the output terminals 4 of the driver chip, merely the structure of the output terminals 4 is shown, while the structure of the receiving terminals 41 on the display panel is not shown, which is thus explained herein.

In an exemplary embodiment, the receiving terminals 41 and the output terminals 4 of the driver chip are connected in one-to-one correspondence. The gull-wing lines 3 or the fanout lines 2 are electrically connected to the receiving terminals 41 first, and the receiving terminals 41 are then electrically connected to the output terminals 4 of the driver chip by bonding.

In an exemplary embodiment, the meaning that the orthographic projections of the gull-wing lines 3 on the substrate overlap with the orthographic projections of at least one of the receiving terminals 41 electrically connected to the gull-wing lines 3 on the substrate is illustrated with a first group S1 of receiving terminals in FIG. 21 as an example: the first group S1 of the receiving terminals include five receiving terminals 41, where the gull-wing lines 3 electrically connected to the five receiving terminals 41 in the first group S1 of the receiving terminals overlap with a first receiving terminal 41 in a direction perpendicular to the substrate; the other four gull-wing lines 3 other than the gull-wing line 3 electrically connected to the first receiving terminal 41 in the first group S1 of the receiving terminals overlap with a second receiving terminal 41 in the direction perpendicular to the substrate; the other three gull-wing lines 3 other than the gull-wing lines 3 electrically connected to the first and second receiving terminals 41 in the first group S1 of the receiving terminals overlap with a third receiving terminal 41 in the direction perpendicular to the substrate; the other two gull-wing lines 3 other than the gull-wing lines 3 electrically connected to the first to third receiving terminals 41 in the first group S1 of the receiving terminals overlap with a fourth receiving terminal 41 in the direction perpendicular to the substrate; and merely a gull-wing line 3 electrically connected to a fifth receiving terminal 41 overlaps with the fifth receiving terminal 41 in the direction perpendicular to the substrate.

It should be noted that FIG. 21 according to the embodiment of the present application merely illustrates an example that the first group S1 of the receiving terminals include five receiving terminals, a second group S2 of receiving terminals include five receiving terminals, and a left region of the bonding region B includes ten gull-wing lines, and in practical application, the specific numbers are not limited and may be determined according to design requirements.

In addition, it should be noted that FIG. 21 according to the embodiment of the present application merely illustrates an example that a plurality of receiving terminals 41 are arranged in two rows, and in practical application, a plurality of receiving terminals 41 may also be arranged in three rows, or, the plurality of receiving terminals 41 are arranged in four rows, or, in some other manners, which may be determined according to the arrangement of the output terminals 4, and will not be limited herein.

Compared with the design in the related art as shown in FIG. 20, where the orthographic projections of the fanout lines 2 on the substrate do not overlap with the orthographic projections of the receiving terminals 41 on the substrate, referring to FIG. 21, according to the embodiment of the present application, the gull-wing lines 3 are provided for winding, and the orthographic projections of the gull-wing lines 3 on the substrate overlap with the orthographic projections of at least one of the receiving terminals 41 electrically connected to the gull-wing lines 3 on the substrate, such that on the one hand, the design space of the fanout region F of the display panel is saved, and on the other hand, the space between the plurality of receiving terminals 41 is saved, and the arrangement position of the receiving terminals 41 may be designed more flexibly. Thus, the arrangement position of the output terminals 4 in the driver chip can be set more flexibly, or the type of a matched driver chip may be selected more flexibly.

Figures 26, 27:
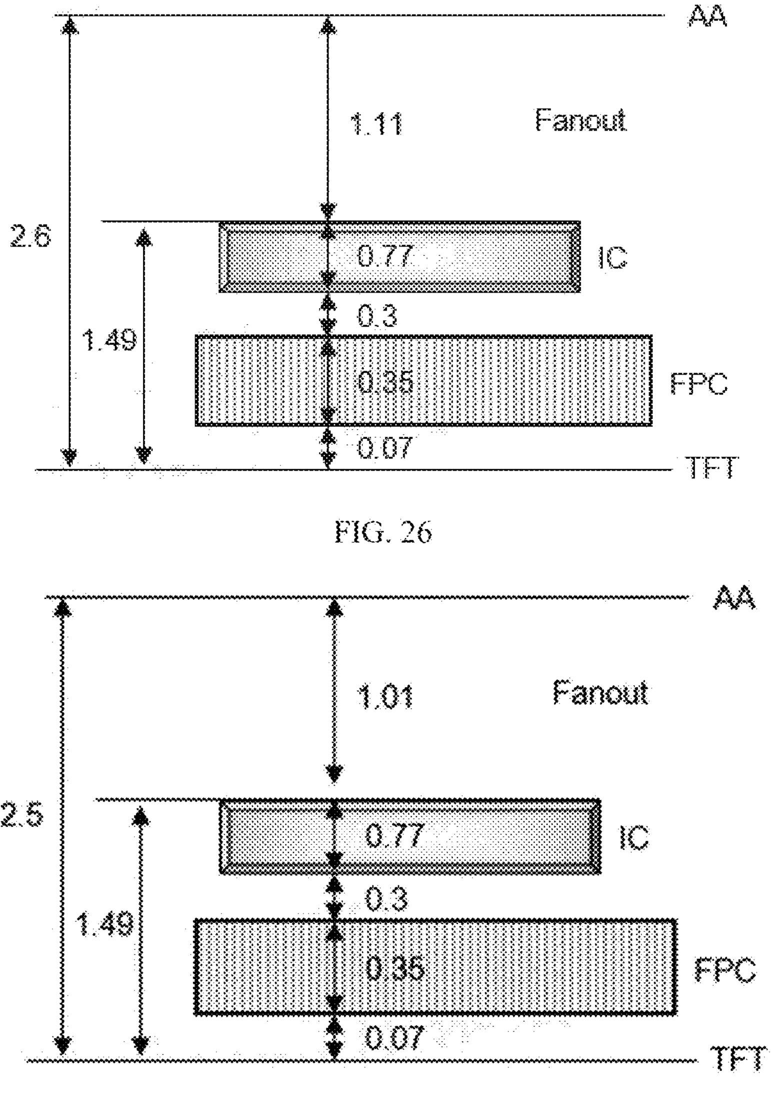
FIG. 26 is a schematic diagram illustrating a design dimension of a display panel shown in FIG. 20.
FIG. 27 is a schematic diagram illustrating a design dimension of a display panel shown in FIG. 21.

In addition, for the display panel according to the embodiment of the present application as shown in FIG. 21, one of the design dimensions of the fanout region F and the bonding region B is as shown in FIG. 27. It can be seen that the width (a distance between an edge of the active area AA and the first side edge of the driver chip IC) of the fanout region F is 1.01 mm; and a distance between the first side edge and the second side edge of the driver chip is 0.77 mm, a width of a flexible printed circuit board (FPC) is 0.35 mm, a distance between the driver chip and the flexible printed circuit board is 0.3 mm, and a distance between the flexible printed circuit board (FPC) and the edge of the display panel (an edge of an array substrate) is 0.07 mm, that is, a width of the bonding region is 1.49 mm. Thus, a width of a lower frame of the display panel is 1.01 mm+1.49 mm=2.5 mm. Design dimensions of the display panel in the related art as shown in FIG. 20 are as shown in FIG. 26. By comparison, it can be seen that the width (the distance between the edge of the active area AA and the first side edge of the driver chip IC) of the fanout region F of the display panel according to the embodiment of the present application as shown in FIG. 21 is decreased by 0.1 mm compared with the width of a fanout region F of the display panel in the related art. The units of numbers marked in FIG. 26 and FIG. 27 are millimeters (mm).

In some embodiments of the present application, referring to FIG. 21, the receiving terminals 41 electrically connected to the gull-wing lines 3 are divided into the first group S1 arranged along the first side edge 101, and the second group S2 arranged along the second side edge 102. The gull-wing lines 3 electrically connected to the first group S1 of the receiving terminals are disposed in the same layer. The gull-wing lines 3 electrically connected to the second group S2 of the receiving terminals include the first gull-wing lines 31 and the second gull-wing lines 32, and the first gull-wing lines 31 and the second gull-wing lines 32 are located in different layers.

The gull-wing lines 3 electrically connected to the first group S1 of the receiving terminals are disposed in the same layer as the second gull-wing lines 32 of the gull-wing lines 3 electrically connected to the second group S2 of the receiving terminals.

In an exemplary embodiment, the gull-wing lines 3 electrically connected to the first group S1 of the receiving terminals are made of the same material as the second gull-wing lines 32 of the gull-wing lines 3 electrically connected to the second group S2 of the receiving terminals. For example, the gull-wing lines are made of the same material as the source-drain metal layer (SD) in the active area AA; or, the gull-wing lines are made of the same material as the gate layer (Gate) in the active area AA.

In an exemplary embodiment, when the gull-wing lines 3 are made of the same material as the source-drain metal layer (SD) in the active area AA, the gull-wing lines 3 may be made in the same layer as the source-drain metal layer (SD) in the active area AA; and when the gull-wing lines 3 are made of the same material as the gate layer (Gate) in the active area AA, the gull-wing lines 3 may be made in the same layer as the gate layer (Gate) in the active area AA.

Figure 25:
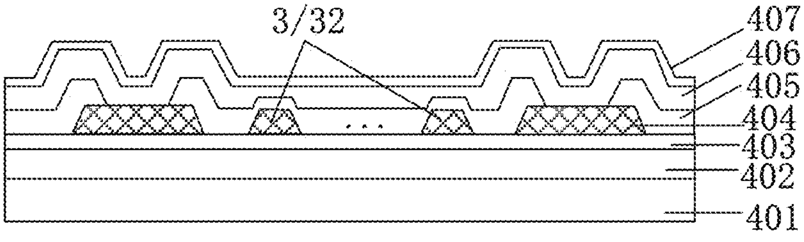
FIG. 25 is a schematic cross-sectional view of FIG. 24 in a direction B1B2.

In some embodiments of the present application, referring to FIG. 25, each of the receiving terminals 41 electrically connected to the gull-wing lines 3 includes:

a gate layer, being located on the substrate 401 and including two conductive pads 404 disposed independently and oppositely;

a dielectric layer 405, covering the gate layer and exposing partial regions of the conductive pads 404;

a source-drain metal layer 406, covering the dielectric layer 405 and being in direct contact with the exposed partial regions of the conductive pads 404; and an electrode layer 407, covering the source-drain metal layer 406 and being configured to be in direct contact with the output terminals 4 of the driver chip.

The gate layer and a gate layer in the active area AA have the same material, are disposed in the same layer, and are prepared in a single composition process.

The above-mentioned electrode layer 407 and a pixel electrode in the active area AA have the same material, are disposed in the same layer, and are prepared in a single composition process.

That the electrode layer 407 covers the source-drain metal layer 406 indicates that an orthographic projection of the electrode layer 407 on the substrate covers an orthographic projection of the source-drain metal layer 406 on the substrate, and an area of the projection of the electrode layer 407 on the substrate is larger than that of the projection of the source-drain metal layer 406 on the substrate. In this way, the source-drain metal layer 406 may be protected.

Referring to FIG. 25, the receiving terminal 41 further includes a buffer layer 402 on the substrate 401, and a gate insulating layer 403 on the buffer layer 402. Certainly, the gate insulating layer 403 may also be located on a side, away from the substrate 401, of the gate layer, which may be determined according to the actual product design and will not be limited herein.

Figure 24:
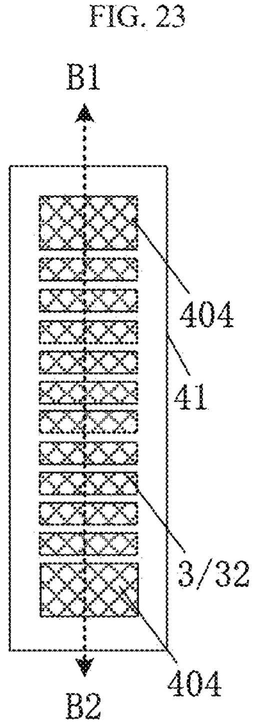
FIG. 24 is a schematic structural diagram of a receiving terminal in FIG. 21.

FIG. 24 illustrates a top view of the receiving terminal 41 according to the embodiment of the present application. FIG. 25 is a cross-sectional view of FIG. 24 in a direction B1B2.

Figure 23:
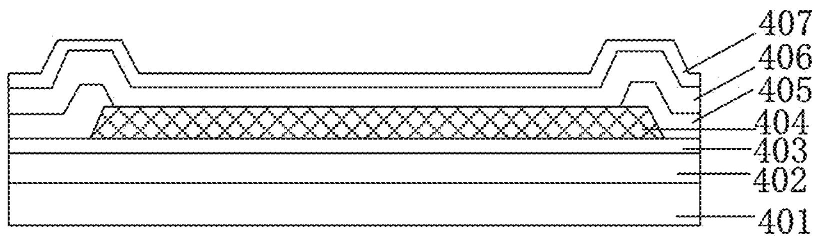
FIG. 23 is a schematic cross-sectional view of FIG. 22 in a direction A1A2.

Compared with the related art as shown in FIG. 22 and FIG. 23, where the conductive pads 404 of the receiving terminals 41 are set as an integrated block structure and occupy a central region of the receiving terminal 41, according to the embodiment of the present application, referring to FIG. 24 and FIG. 25, the two conductive pads 404 are disposed independently and oppositely in regions at the two ends of the receiving terminal 41, such that on the one hand, one of the two conductive pads 404 may be used as a backup conductive pad for repair and replacement when one conductive pad 404 is abnormal; and on the other hand, since the two conductive pads 404 are disposed in the regions of the two ends of the receiving terminal 41 oppositely, a region between the two conductive pads 404 of the receiving terminal 41 is reserved for the design of other structures, thus increasing the design space. FIG. 23 is a cross-sectional view of FIG. 22 in a direction A1A2.

In some embodiments of the present application, referring to FIG. 21 and FIG. 24, the gull-wing lines 3 electrically connected to the first group S1 of the receiving terminals and the second gull-wing lines 32 of the gull-wing lines 3 electrically connected to the second group S2 of the receiving terminals are located in the gate layer, and pass through the region between the two conductive pads 404 of the receiving terminals 41.

According to the embodiment of the present application, since the two conductive pads 404 are disposed in the regions of the two ends of the receiving terminal 41 oppositely, the region between the two conductive pads 404 of the receiving terminal 41 is reserved, and the gull-wing lines 3 are disposed in the gate layer, and pass through the region between the two conductive pads 404 of the receiving terminal 41. Compared with the related art that lines pass through a region between the receiving terminals 41, the design method according to the embodiment of the present application greatly saves the design space of the bonding region and the fanout region of the display panel while ensuring normal and stable transmission of electrical signals. As a result, on the one hand, high-frequency charging may be realized by appropriately increasing the line width of the lines, and on the other hand, the preparation of display products with narrow bezels is facilitated.

In some embodiments of the present application, referring to FIG. 21, for one receiving terminal 41 in the first group S1 of the receiving terminals, a gull-wing line 3 is electrically connected to conductive pad 404 of the receiving terminal, and orthographic projections of other gull-wing lines 3 electrically connected to the first group S1 of the receiving terminals on the substrate do not overlap with orthographic projections of the conductive pad 404 of the receiving terminal on the substrate; and for one receiving terminal 41 in the second group S2 of the receiving terminals, a second gull-wing line 32 is electrically connected to conductive pad 404 of the receiving terminal, and orthographic projections of other second gull-wing lines 32 electrically connected to the second group S2 of the receiving terminals on the substrate do not overlap with orthographic projections of the conductive pad 404 of the receiving terminal on the substrate.

According to the embodiment of the present application, since the gull-wing lines that overlap with the receiving terminals 41 in the direction perpendicular to the substrate are located in the gate layer, and the conductive pads 404 of the receiving terminals 41 are also located in the gate layer, in order to avoid signal transmission misalignment between the receiving terminals 41 and the gull-wing lines 3, one receiving terminal 41 of all the receiving terminals 41 electrically connected to the gull-wing lines 3 is set to merely overlap with the gull-wing lines 3 electrically connected to the receiving terminal in the direction perpendicular to the substrate, and does not overlap with other gull-wing lines 3 in the direction perpendicular to the substrate.

Figures 39, 40:
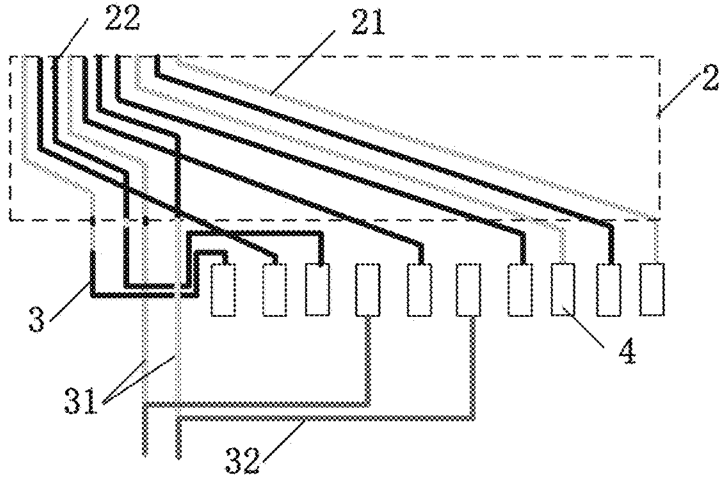

In some embodiments of the present application, referring to FIG. 40, the display panel further includes a plurality of spare receiving terminals 42. The spare receiving terminals 42 are of the same structure as the receiving terminals 41.

Spare receiving terminals 42 disposed in the same row as the first group S1 of the receiving terminals are first spare receiving terminals, and spare receiving terminals 42 disposed in the same row as the second group S2 of the receiving terminals are second spare receiving terminals.

At least part of the gull-wing lines 3 electrically connected to the first group of the receiving terminals pass through a region between two conductive pads 404 in the first spare receiving terminals, and at least part of the gull-wing lines 3 electrically connected to the second group of the receiving terminals pass through a region between two conductive pads 404 in the second spare receiving terminals.

In an exemplary embodiment, referring to FIG. 40, the spare receiving terminals 42 are not electrically connected to the gull-wing lines 3.

The specific number of the spare receiving terminals (dummy receiving terminals) 42 in the display panel is not limited herein. Exemplarily, the number of the spare receiving terminals 42 is 5, where the number of the first spare receiving terminals is 2, and the number of the second spare receiving terminals is 3.

In an exemplary embodiment, the spare receiving terminals 42 are located at two ends of the plurality of receiving terminals 41; or, referring to FIG. 40, the spare receiving terminals 42 are located on one side of the plurality of receiving terminals 41, where the first spare receiving terminals are located on the left side of the first group of receiving terminals 41 and the second spare receiving terminals are located on the left side of the second group of receiving terminals 41; or, the spare receiving terminals 42 and the receiving terminals 41 are interval disposed.

In an exemplary embodiment, referring to FIG. 40, no gull-wing lines 3 are disposed in a region between two conductive pads 404 of part of the receiving terminals 41. Certainly, at least one gull-wing lines 3 may pass through the region between the two conductive pads 404 of each receiving terminal 41, which may be determined according to the actual situation.

In some embodiments of the present application, referring to FIG. 15, the fanout lines 2 include the display fanout lines 21 and the touch fanout lines 22.

The touch fanout lines 22 extend from the fanout region F to the region where the first side edge 101 is located, and are electrically connected to the output terminals 4. Part of the display fanout lines 21 are electrically connected to the output terminals via the gull-wing lines 3.

It should be noted that, in practical application, because the number of the touch fanout lines 22 is less than that of the display fanout lines 21, the display fanout lines 21 may be electrically connected to the output terminals 4 by winding the gull-wing lines 3, which may facilitate arrangement of the fanout lines 2 in the fanout region F.

Certainly, for current mainstream display products, because the number of the touch fanout lines 22 is less than that of the display fanout lines 21, the display fanout lines 21 are electrically connected to the output terminals 4 by winding the gull-wing lines 3; and for individual display products, due to design needs, the touch fanout lines 22 may also be electrically connected to the output terminals 4 by winding the gull-wing lines 3. Only current actual requirements are illustrated herein.

In addition, FIG. 15 according to the embodiment of the present application merely illustrates an example that the gull-wing lines 3 pass through the region where the second side edge 102 is located.

In an exemplary embodiment, in the structure as shown in FIG. 18, when the gull-wing lines 3 pass through the region where the first side edge 101 is located, for the fanout lines 2 electrically connected to this part of gull-wing lines 3, a certain design space is released between the fanout lines 2 electrically connected to the gull-wing lines 3 and the fanout lines 2 not electrically connected to the gull-wing lines 3, and the gull-wing lines 3 may extend from the bonding region B to the fanout region F, and wind from the region where the first side edge 101 is located, such that this part of fanout lines 2 are electrically connected to the output terminals 4 via the gull-wing lines 3. Since the space of the region where the first side edge 101 is located is limited, the gull-wing lines 3 electrically connected to the display fanout lines 21 may be set to pass through the region where the first side edge 101 is located, and be electrically connected to the output terminals 4.

In an exemplary embodiment, according to the structure shown in FIG. 4, when the gull-wing lines 3 pass through the region where the second side edge 102 of the driver chip IC is located, the part of fanout lines 2 electrically connected to this part of gull-wing lines 3 may all be set as display fanout lines 21, such that the display fanout lines 21 pass through the region where the second side edge 102 of the driver chip IC is located, and then are electrically connected to the output terminals 4; and another part of the display fanout lines 21 and all the touch fanout lines 22 extend from the fanout region F to the bonding region B, and are electrically connected to the output terminals 4 after passing through the region where the first side edge is located.

Figure 28:
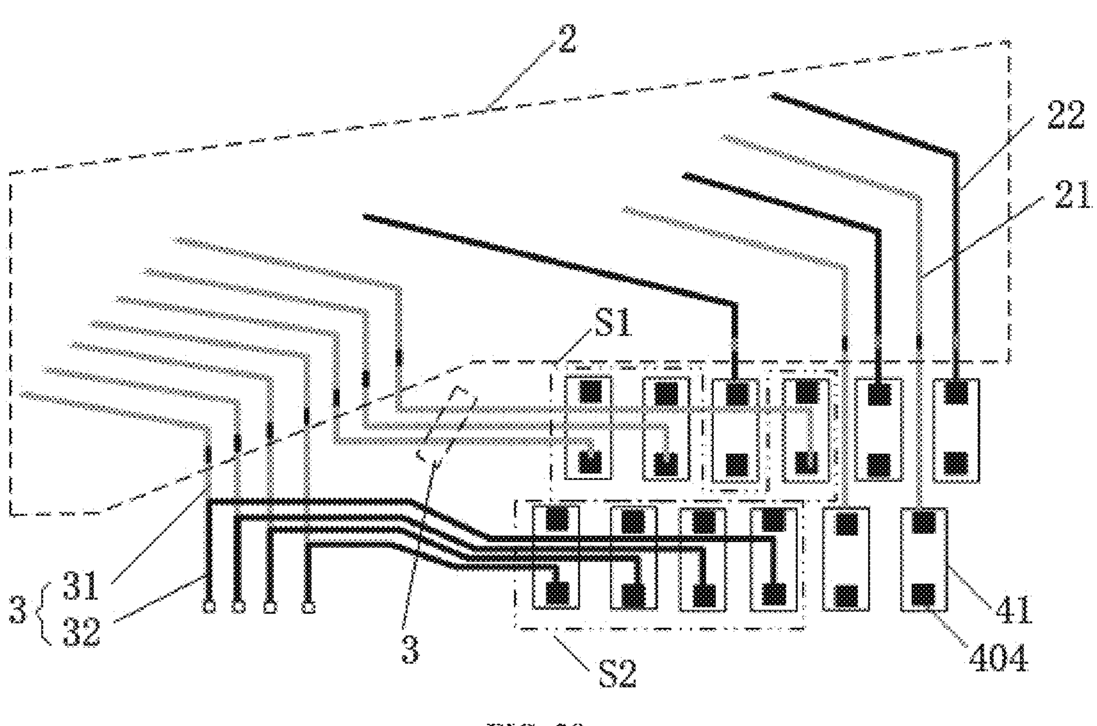
FIG. 28 to FIG. 40 are schematic structural diagrams of still another twelve display panels according to embodiments of the present application.

In an exemplary embodiment, referring to FIG. 28, the fanout lines 2 include the display fanout lines 21 and the touch fanout lines 22, the touch fanout lines 22 extend from the fanout region F to the region where the first side edge 101 is located, and are electrically connected to the receiving terminals 41, and the receiving terminals 41 are electrically connected to the output terminals 4 (the structure of the output terminals 4 of the driver chip is not shown in FIG. 28); and part of the display fanout lines 21 are electrically connected to the receiving terminals 41 via the gull-wing lines 3, and the gull-wing lines 3 pass through the regions where the two sides (the third side edges 103) of the driver chip are located.

The display fanout lines 21 electrically connected to the receiving terminals 41 via the gull-wing lines 3 may be divided into two parts.

The gull-wing lines 3 electrically connected to a first part of display fanout lines 21 are located in the gate layer, and this part of gull-wing lines 3 pass through the region between the two conductive pads 404 of the receiving terminals 41, and are electrically connected to one of the conductive pads 404 of the corresponding receiving terminals 41.

The gull-wing lines 3 electrically connected to a second part of display fanout lines 21 include the first gull-wing lines 31 and the second gull-wing lines 32, and the first gull-wing lines 31 and the second gull-wing lines 32 are located in different layers. Each first gull-wing line 31 overlaps with a second gull-wing line 32 electrically connected to the first gull-wing line in the direction perpendicular to the substrate, and an extension direction of an overlapping region thereof is parallel to extension directions of the first gull-wing line 31 and the second gull-wing line 32. The second gull-wing lines 32 in the gull-wing lines 3 electrically connected to the second part of display fanout lines 21 are located in the gate layer, and this part of second gull-wing lines 32 pass through the region between the two conductive pads 404 of the receiving terminals 41, and are electrically connected to one of the conductive pads 404 of the corresponding receiving terminals 41.

Exemplarily, referring to FIG. 28, the receiving terminals 41 electrically connected to the gull-wing lines 3 may be divided into the first group S1 arranged along the first side edge 101, and the second group S2 arranged along the second side edge 102. The gull-wing lines 3 electrically connected to the first group S1 of the receiving terminals are disposed in the same layer. The gull-wing lines 3 electrically connected to the second group S2 of the receiving terminals include the first gull-wing lines 31 and the second gull-wing lines 32, and the first gull-wing lines 31 and the second gull-wing lines 32 are located in different layers.

The gull-wing lines 3 electrically connected to the first group S1 of the receiving terminals are disposed in the same layer as the second gull-wing lines 32 of the gull-wing lines 3 electrically connected to the second group S2 of the receiving terminals. In addition, the gull-wing lines 3 electrically connected to the first group S1 of the receiving terminals and the second gull-wing lines 32 of the gull-wing lines 3 electrically connected to the second group S2 of the receiving terminals are located in the gate layer, and pass through the region between the two conductive pads 404 of the receiving terminals 41.

Figure 29:
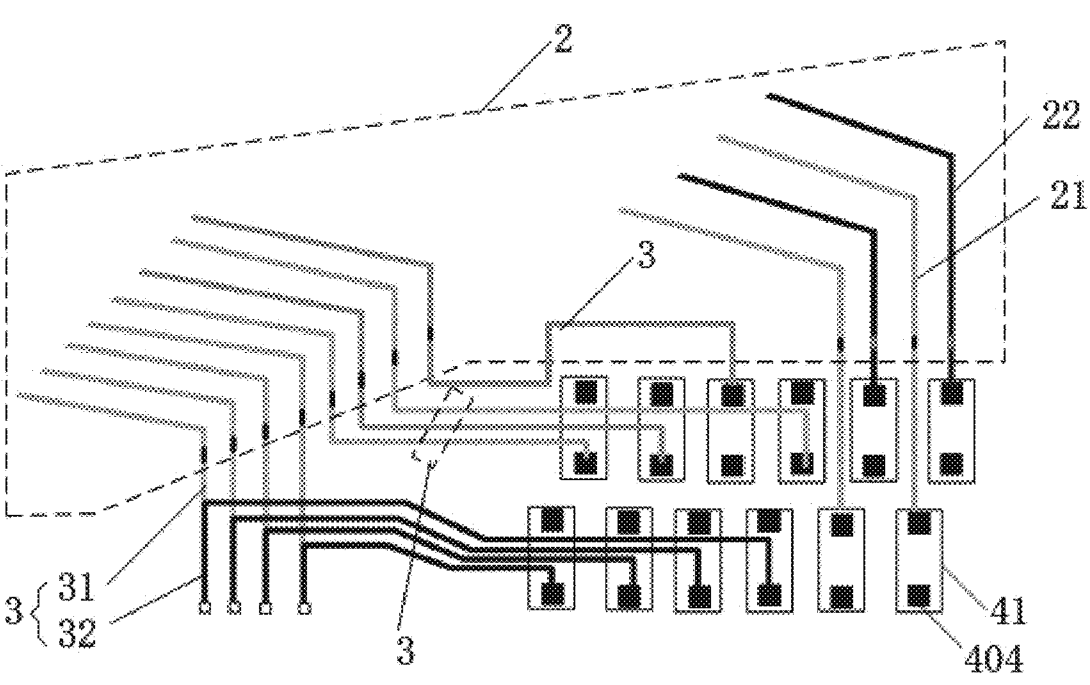

In an exemplary embodiment, referring to FIG. 29, the touch fanout lines 22 extend from the fanout region F to the region where the first side edge 101 is located, and are electrically connected to the receiving terminals 41, and the receiving terminals 41 are electrically connected to the output terminals 4 (the structure of the output terminals 4 of the driver chip is not shown in FIG. 29); and part of the display fanout lines 21 are electrically connected to the receiving terminals 41 via the gull-wing lines 3, and the gull-wing lines 3 pass through the regions where the two sides (the third side edges 103) of the driver chip are located. The display fanout lines 21 electrically connected to the receiving terminals 41 via the gull-wing lines 3 may be divided into three parts.

A first part of display fanout lines 21 are electrically connected to the receiving terminals 41 via the gull-wing lines 3, and the gull-wing lines 3 pass through the region where the first side edge 101 is located.

The gull-wing lines 3 electrically connected to a second part of display fanout lines 21 are located in the gate layer, and this part of gull-wing lines 3 pass through the region between the two conductive pads 404 of the receiving terminals 41, and are electrically connected to one of the conductive pads 404 of the corresponding receiving terminals 41.

The gull-wing lines 3 electrically connected to a third part of display fanout lines 21 include the first gull-wing lines 31 and the second gull-wing lines 32, and the first gull-wing lines 31 and the second gull-wing lines 32 are located in different layers. Each first gull-wing line 31 overlaps with a second gull-wing line 32 electrically connected to the first gull-wing line in the direction perpendicular to the substrate, and an extension direction of an overlapping region thereof is parallel to an extension direction of the first gull-wing line 31. The second gull-wing lines 32 in the gull-wing lines 3 electrically connected to the three parts of display fanout lines 21 are located in the gate layer, and this part of second gull-wing lines 32 pass through the region between the two conductive pads 404 of the receiving terminals 41, and are electrically connected to one of the conductive pads 404 of the corresponding receiving terminals 41.

Figures 30, 31:
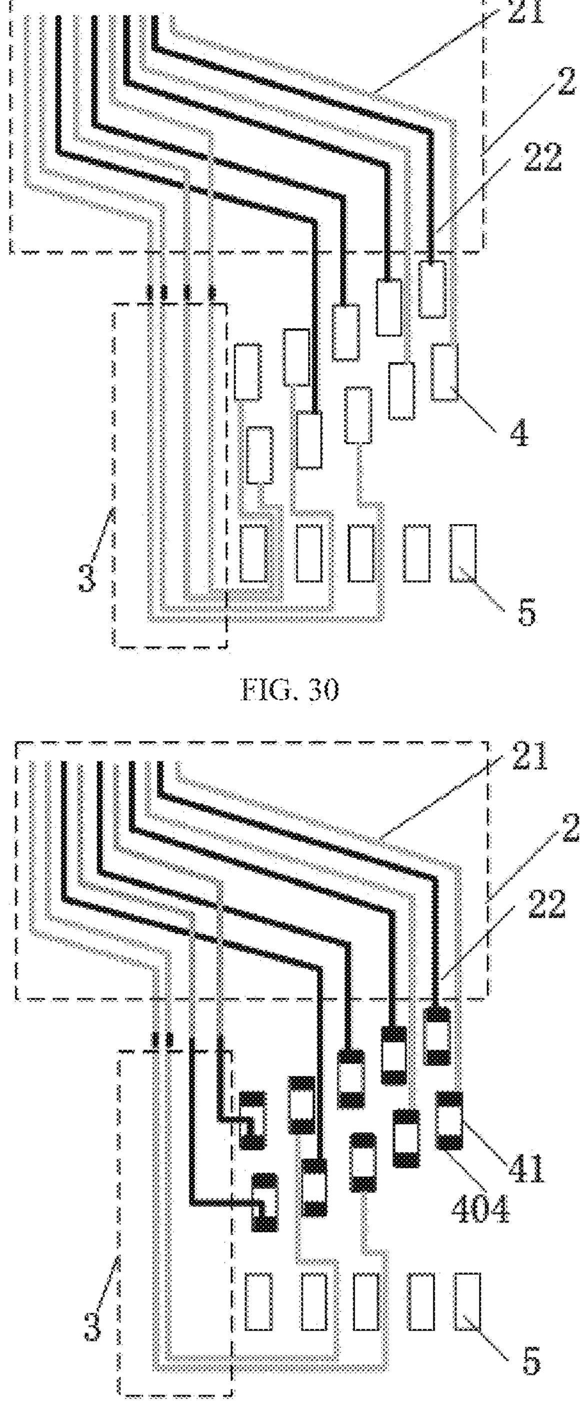

In an exemplary embodiment, referring to FIG. 30, for a sunken driver chip, since a region occupied by output terminals 4 and input terminals 5 thereof is triangular, and the design space between a region where the output terminals 4 are located and a region where the input terminals 5 are located is limited, the touch fanout lines 22 and part of the display fanout lines 21 may be set to extend from the fanout region F to the region where the first side edge 101 is located, and be electrically connected to the output terminals 4; and part of the display fanout lines 21 are electrically connected to the output terminals 4 by enabling the gull-wing lines 3 to pass through a region where a lower side (the second side edge 102) of the driver chip is located and to pass through the region where the input terminals 5 are located.

In an exemplary embodiment, referring to FIG. 31, the touch fanout lines 22 and part of the display fanout lines 21 are set to extend from the fanout region F to the region where the first side edge 101 is located, and be electrically connected to the receiving terminals 41, and part of the display fanout lines 21 are electrically connected to the receiving terminals 41 via the gull-wing lines 3.

The display fanout lines 21 electrically connected to the receiving terminals 41 via the gull-wing lines 3 are divided into two parts. A first part of display fanout lines 21 are electrically connected to the output terminals 4 (actually the display fanout lines are electrically connected to the receiving terminals 41 first, and the receiving terminals 41 are electrically connected to the output terminals 4) by enabling the gull-wing lines 3 to pass through the region where the lower side (the second side edge 102) of the driver chip is located and to pass through the region where the input terminal 5 is located. The gull-wing lines 3 electrically connected to a second part display fanout lines 21 pass through the regions where the two sides (the third side edges 103) of the driver chip are located, pass through the region between the two conductive pads 404 of the receiving terminal 41, and are then electrically connected to one of the conductive pads 404 of the corresponding receiving terminals 41. The gull-wing lines 3 connected to the second part of display fanout lines 21 are located in the gate layer, and are disposed in the same layer as the conductive pads 404.

Figure 32:
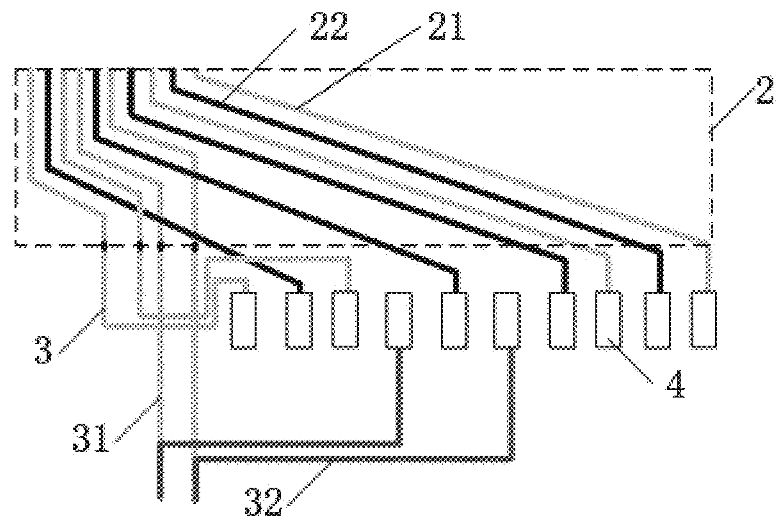

In an exemplary embodiment, referring to FIG. 32, the touch fanout lines 22 and part of the display fanout lines 21 are set to extend from the fanout region F to the region where the first side edge 101 is located, and be electrically connected to the output terminals 4, and part of the display fanout lines 21 are electrically connected to the output terminals 4 via the gull-wing lines 3. The display fanout lines 21 electrically connected to the output terminals 4 via the gull-wing lines 3 are divided into two parts. A first part of display fanout lines 21 are electrically connected to the output terminals 4 by enabling the gull-wing lines 3 to pass through the region where the upper side (the first side edge 101) of the driver chip is located. The gull-wing lines 3 electrically connected to a second part of display fanout lines 21 include the first gull-wing lines 31 and the second gull-wing lines 32, and the first gull-wing lines 31 and the second gull-wing lines 32 are located in different layers. Each first gull-wing line 31 overlaps with a second gull-wing line 32 electrically connected to the first gull-wing line in the direction perpendicular to the substrate, and an extension direction of an overlapping region thereof is parallel to an extension direction of the first gull-wing line 31.

Figure 37:
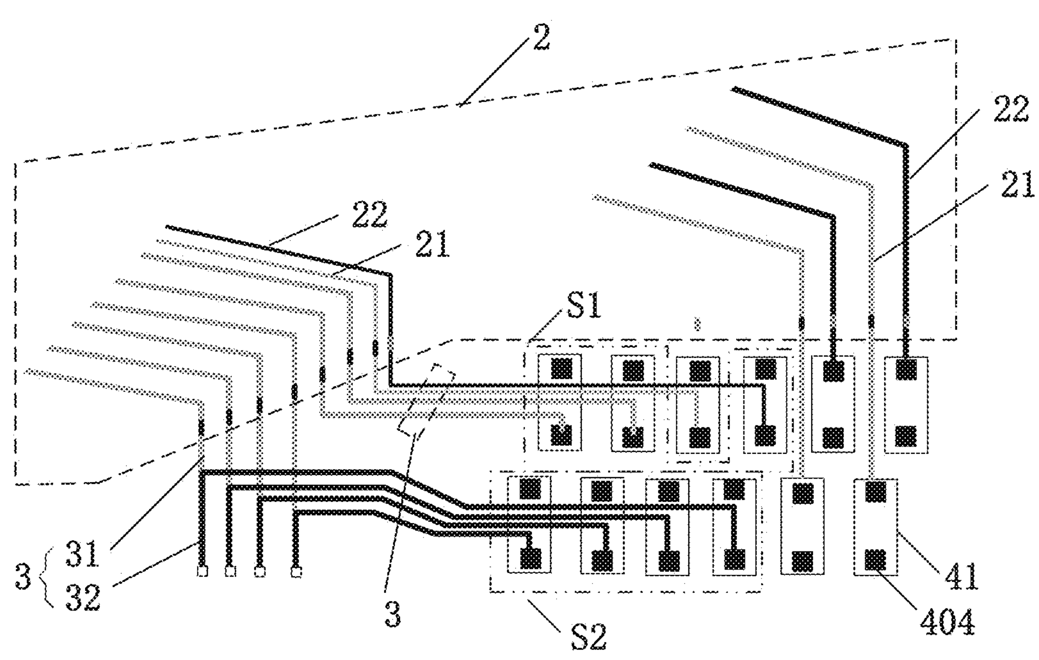
Figure 38:
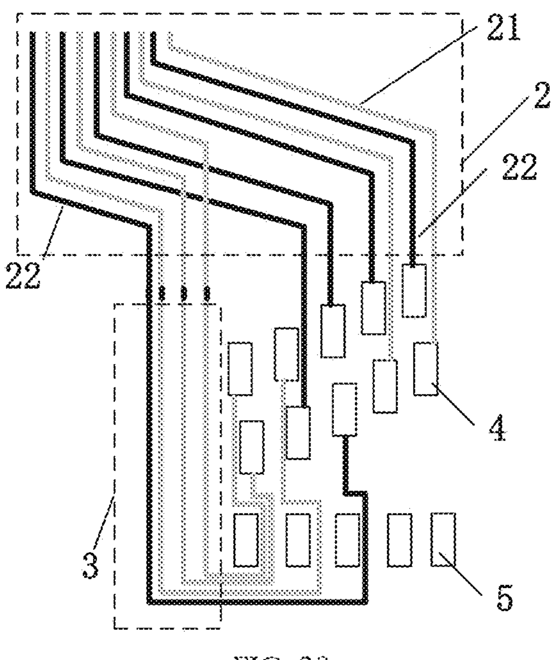

In an exemplary embodiment, referring to FIG. 37 or FIG. 38, the gull-wing lines 3 include the display gull-wing lines and the touch gull-wing lines; and the fanout lines 2 include the display fanout lines 21 and the touch fanout lines 22.

Part of the display fanout lines 21 are electrically connected to the output terminals 4 via the display gull-wing lines, and part of the touch fanout lines 22 are electrically connected to the output terminals 4 via the touch gull-wing lines.

It should be noted that in FIG. 37 and FIG. 38 according to the embodiment of the present application, no distinction is made between the numerals of the display gull-wing lines and the touch gull-wing lines. The gull-wing lines 3 electrically connected to the display fanout lines 21 are the display gull-wing lines, and the gull-wing lines 3 electrically connected to the touch fanout lines 22 are the touch gull-wing lines.

In an exemplary embodiment, referring to FIG. 37, part of the touch fanout lines 22 and part of the display fanout lines 21 extend from the fanout region F to the region where the first side edge 101 is located, and are electrically connected to the receiving terminals 41, and the receiving terminals 41 are electrically connected to the output terminals 4 (the structure of the output terminals 4 of the driver chip is not shown in FIG. 37); and another part of the display fanout lines 21 are electrically connected to the receiving terminals 41 via the display gull-wing lines, and another part of the touch gull-wing lines 22 are electrically connected to the receiving terminals 41 via the touch gull-wing lines. The gull-wing lines 3 (including the display gull-wing lines and the touch gull-wing lines) pass through the regions where the two sides (the third side edges 103) of the driver chip are located.

In an exemplary embodiment, referring to FIG. 38, for the sunken driver chip, since the region occupied by the output terminals 4 and the input terminals 5 thereof is triangular, and the design space between the region where the output terminals 4 are located and the region where the input terminals 5 are located is limited, part of the touch fanout lines 22 and part of the display fanout lines 21 may be set to extend from the fanout region F to the region where the first side edge 101 is located, and be electrically connected to the output terminals 4; and another part of the display fanout lines 21 are electrically connected to the output terminals 4 by enabling the display gull-wing lines to pass through the region where the lower side (the second side edge 102) of the driver chip is located and to pass through the region where the input terminals 5 are located, and another part of the touch fanout lines 22 are electrically connected to the output terminals 4 by enabling the touch gull-wing lines to pass through the region where the lower side (the second side edge 102) of the driver chip is located and to pass through the region where the input terminals 5 are located.

In an exemplary embodiment, referring to FIG. 39, part of the touch fanout lines 22 and part of the display fanout lines 21 are set to extend from the fanout region F to the region where the first side edge 101 is located, and be electrically connected to the output terminals 4; and another part of the display fanout lines 21 are electrically connected to the output terminals 4 via the display gull-wing lines, and another part of the touch gull-wing lines 22 are electrically connected to the output terminals 4 via the touch gull-wing lines.

The display fanout lines 21 electrically connected to the output terminals 4 via the display gull-wing lines (the gull-wing lines 3 electrically connected to the display fanout lines 21) are divided into two parts. A first part of display fanout lines 21 are electrically connected to the output terminals 4 by enabling the display gull-wing lines to pass through the region where the upper side (the first side edge 101) of the driver chip is located. The display gull-wing lines electrically connected to a second part of display fanout lines 21 include the first gull-wing lines 31 and the second gull-wing lines 32, and the first gull-wing lines 31 and the second gull-wing lines 32 are located in different layers. Each first gull-wing line 31 overlaps with a second gull-wing line 32 electrically connected to the first gull-wing line in the direction perpendicular to the substrate, and an extension direction of an overlapping region thereof is parallel to an extension direction of the first gull-wing line 31.

The touch fanout lines 22 electrically connected to the output terminals 4 via the touch gull-wing lines (the gull-wing lines 3 electrically connected to the touch fanout lines 22) are also divided into two parts. A first part of touch fanout lines 22 are electrically connected to the output terminals 4 by enabling the touch gull-wing lines to pass through the region where the upper side (the first side edge 101) of the driver chip is located. The touch gull-wing lines electrically connected to a second part of touch fanout lines 22 also include the first gull-wing lines 31 and the second gull-wing lines 32, and the first gull-wing lines 31 and the second gull-wing lines 32 are located in different layers. Each first gull-wing line 31 overlaps with a second gull-wing line 32 electrically connected to the first gull-wing line in the direction perpendicular to the substrate, and an extension direction of an overlapping region is parallel to an extension direction of the first gull-wing line 31.

Figure 6:
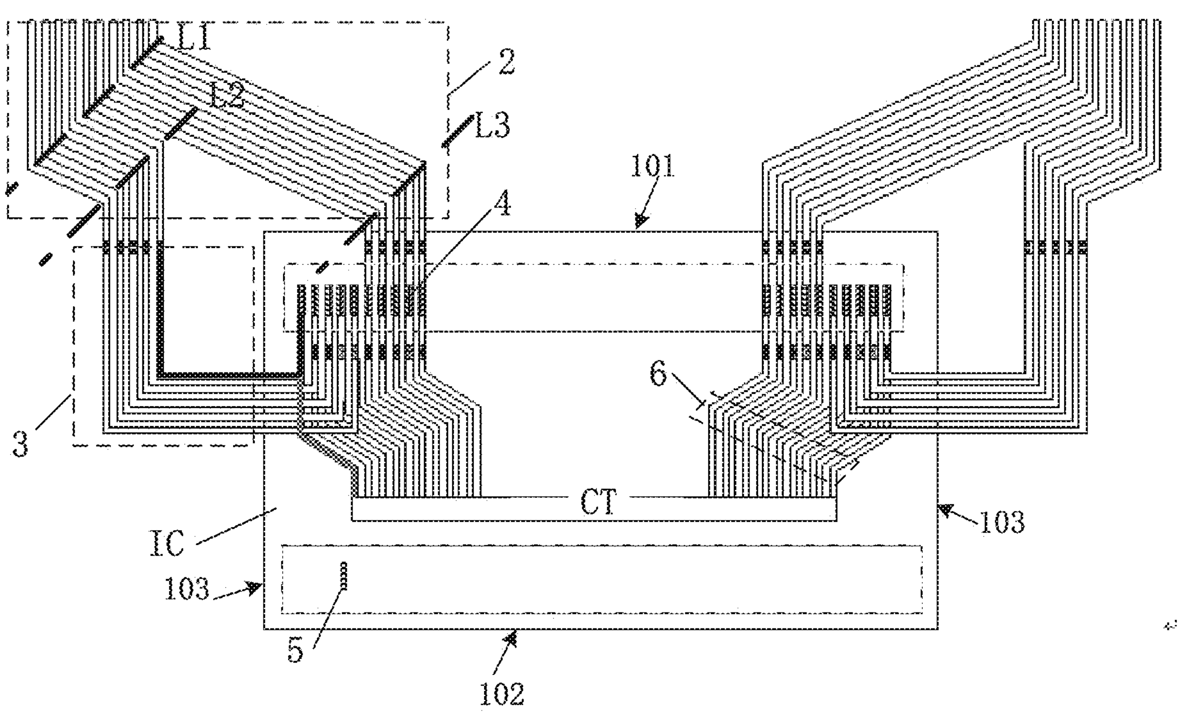
Figure 7:
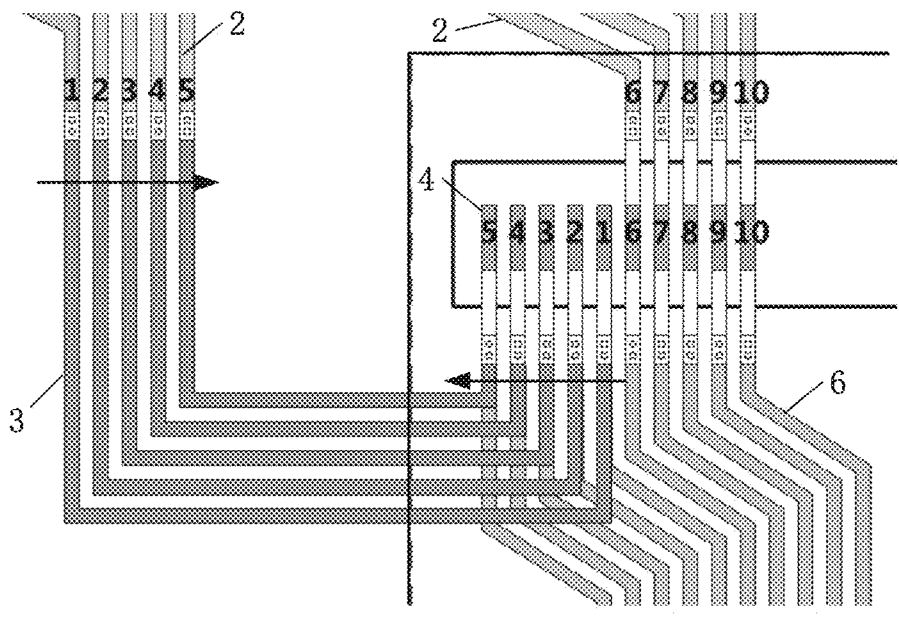
FIG. 7 is a schematic structural diagram of a bonding region of a display panel shown in FIG. 6.

In an exemplary embodiment, referring to FIG. 4, FIG. 6, and FIG. 7, the gull-wing lines 3 may be located in the same layer.

When the gull-wing lines 3 are made of the same material as the source-drain metal layer (SD) in the active area AA, the gull-wing lines 3 may be made in the same layer as the source-drain metal layer (SD) in the active area AA; and when the gull-wing lines 3 are made of the same material as the gate layer (Gate) in the active area AA, the gull-wing lines 3 may be made in the same layer as the gate layer (Gate) in the active area AA.

Exemplarily, referring to FIG. 4, FIG. 6, and FIG. 7, the order of ends, connected to the fanout lines 2, of the gull-wing lines 3 are opposite to the order of ends, connected to the output terminals 4, of the gull-wing lines 3. In this case, in order to avoid the problem of signal misalignment caused by an inconsistent position order of the lines, the order of output signals of the output terminals 4 may be adjusted by the driver chip. FIG. 7 is an enlarged view of a partial region in FIG. 6.

In some embodiments of the present application, referring to FIG. 18, part of the gull-wing lines 3 are disposed in the same layer, another part of the gull-wing lines 3 include the first gull-wing lines 31 and the second gull-wing lines 32, and the first gull-wing lines 31 and the second gull-wing lines 32 are located in different layers.

The gull-wing lines 3 disposed in the same layer each includes a first line segment a, a second line segment b, a third line segment c, a fourth line segment d, and a fifth line segment e that are connected in sequence, where the first line segment a and the second line segment b are located in the bonding region B, the third line segment c extends from the bonding region B to the fanout region F, and the fourth line segment d and the fifth line segment e are located in the fanout region F; and the first line segment a is electrically connected to the fanout lines 2, and the fifth line segment e is electrically connected to the output terminals 4.

In addition, the orders of the fanout lines 2 electrically connected to the first line segments a, the first line segments a, the fifth line segments e, and the output terminals 4 electrically connected to the fifth line segments e are all the same, thus ensuring that the fanout lines 2 are electrically connected to the output terminals 4 in signal correspondence, and avoiding the problem of signal misalignment.

In practical application, since part of the fanout lines 2 are electrically connected to the output terminals 4 of the driver chip after the gull-wing lines 3 wind from the bonding region B, an available space F1 exists between the fanout lines 2 electrically connected to the gull-wing lines 3 and the fanout lines 2 not electrically connected to the gull-wing lines 3 in the fanout region F, such that the gull-wing lines 3 extend from the bonding region B to the region marked as F1 in FIG. 18, then pass through the region where the first side edge 101 of the driver chip is located, and are electrically connected to the output terminals 4. In this way, more fanout lines 2 may be set to be electrically connected to the output terminals 4 by winding the gull-wing lines 3, and thus the design space of the fanout region F and the bonding region B may be reduced.

Figure 8:
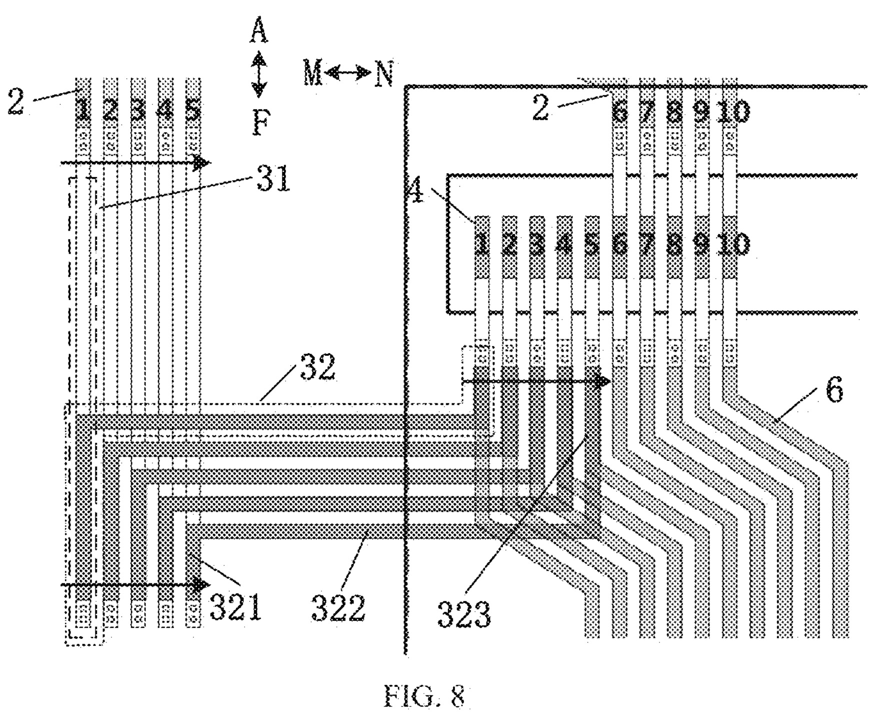
FIG. 8 is a schematic structural diagram of a bonding region of a display panel shown in FIG. 3.

In some embodiments of the present application, referring to FIG. 3 and FIG. 8, each gull-wing line 3 includes the first gull-wing line 31 and the second gull-wing line 32, and the first gull-wing line 31 and the second gull-wing line 32 are located in different layers.

Exemplarily, when the first gull-wing lines 31 are made of the same material as the source-drain metal layer (SD) in the active area AA, the first gull-wing lines 31 may be made in the same layer as the source-drain metal layer (SD) in the active area AA; and when the second gull-wing lines 32 are made of the same material as the gate layer (Gate) in the active area AA, the second gull-wing lines 32 may be made in the same layer as the gate layer (Gate) in the active area AA.

Or, when the first gull-wing lines 31 are made of the same material as the gate layer (Gate) in the active area AA, the first gull-wing lines 31 may be made in the same layer as the gate layer (Gate) in the active area AA; and when the second gull-wing lines 32 are made of the same material as the source-drain metal layer (SD) in the active area AA, the second gull-wing lines 32 may be made in the same layer as the source-drain metal layer (SD) in the active area AA.

The first gull-wing lines 31 extend in a first direction AF. The second gull-wing lines 32 include first line segments 321 extending in a second direction FA. The first gull-wing lines 31 are electrically connected to the fanout lines 2 and the first line segments 321. The first direction AF is a direction that the active area AA points to the bonding region B, and the second direction FA is parallel to the first direction AF.

Orthographic projections of the first line segments 321 on the substrate of the display panel overlap with orthographic projections of the first gull-wing lines 31 electrically connected to the first line segments on the substrate.

In an exemplary embodiment, when the line width of the first line segments 321 is smaller than or equal to the line width of the first gull-wing lines 31, the orthographic projections of the first line segments 321 on the substrate of the display panel are located within the orthographic projections of the first gull-wing lines 31 electrically connected to the first line segments on the substrate.

In an embodiment of the present application, referring to FIG. 3, since part of the fanout lines 2 in the fanout region F are electrically connected to the output terminals 4 of the driver chip by winding the gull-wing lines 3, a length d4 of part of line segments, located in the fanout region F, of the fanout lines 2 electrically connected to the gull-wing lines 3 is greatly shortened compared with a length d3 of part of line segments, located in the fanout region F, of the fanout lines 2 not electrically connected to the gull-wing lines 3, such that the resistance of the fanout lines 2 not electrically connected to the gull-wing lines 3 is much greater than the resistance of the fanout lines 2 electrically connected to the gull-wing lines 3, thereby reducing resistance compatibility between the lines in the display panel and resulting in unstable signal transmission.

According to the embodiment of the present application, due to the fact that the first line segments 321 are provided, and the orthographic projections of the first line segments 321 on the substrate of the display panel overlap with the orthographic projections of the first gull-wing lines 31 electrically connected to the first line segments on the substrate, the line distance from the fanout lines 2 electrically connected to the gull-wing lines 3 to the output terminals 4 is prolonged, the shortened length of the fanout lines 2 electrically connected to the gull-wing lines 3 can be offset to a certain extent, the resistance compatibility between different lines can be improved, and thus the stability of signal transmission can be improved.

In some embodiments of the present application, referring to FIG. 8, the second gull-wing lines 32 further include second line segments 322 and third line segments 323. The second line segments 322 extend in a third direction MN. The first line segments 321, the second line segments 322, and the third line segments 323 are connected in sequence. The third line segments 323 are electrically connected to the output terminals 4. The third direction MN intersects the first direction AF.

The first gull-wing lines 31, the first line segments 321, and the third line segments 323 are arranged in the same order in the third direction MN.

Specifically, referring to FIG. 8, a first first gull-wing line 31, a second first gull-wing line 31, a third first gull-wing line 31, a fourth first gull-wing line 31, and a fifth first gull-wing line 31 are arranged in the third direction MN in sequence; a first first line segment 321, a second first line segment 321, a third first line segment 321, a fourth first line segment 321, and a fifth first line segment 321 are arranged in the third direction MN in sequence; and a first third line segment 323, a second third line segment 323, a third third line segment 323, a fourth third line segment 323, and a fifth third line segment 323 are arranged in the third direction MN in sequence.

In an exemplary embodiment, an angle between the third direction and the first direction may be a right angle, or, the angle between the third direction and the first direction may be an obtuse angle. It should be noted that for the third direction MN marked in the drawings according to the embodiment of the present application, the angle between the third direction MN and the first direction AF is a right angle.

In the embodiment of the present application, the order of the gull-wing lines 3 and the output terminals 4 is adjusted by using the jumper design, such that the fanout lines 2 are electrically connected to the corresponding output terminals 4 without the need for the driver chip to adjust an order of output signals in the output terminals 4.

It should be noted that the jumper design shown in FIG. 8 may also be adopted when the gull-wing lines 3 wind from the second side edge 102 of the driver chip, and FIG. 8 merely illustrates an example that the gull-wing lines 3 wind from the left side (the third side edge) of the driver chip.

In some embodiments of the present application, referring to FIG. 8, an angle between an extension line of the first line segment 321 and an extension line of the second line segment 322 is a right angle, and an angle between the extension line of the second line segment 322 and an extension line of the third line segment 323 is a right angle.

Figure 33:
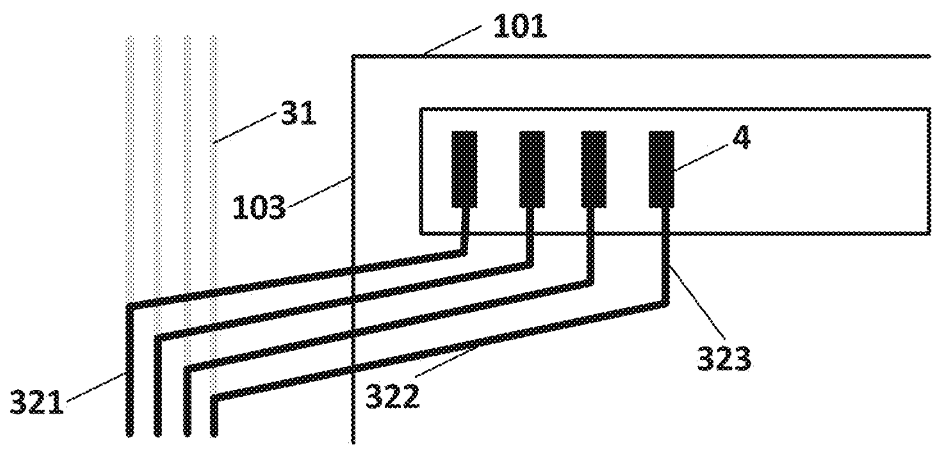

Or, referring to FIG. 33, the angle between the extension line of the first line segment 321 and the extension line of the second line segment 322 is an obtuse angle, the angle between the extension line of the second line segment 322 and the extension line of the third line segment 323 is an obtuse angle, and the two obtuse angles are the same.

Or, one of the angle between the extension line of the first line segment and the extension line of the second line segment and the angle between the extension line of the second line segment and the extension line of the third line segment is a right angle, and the other is an obtuse angle.

In an exemplary embodiment, due to the fact that the orthographic projections of the first line segments 321 of the second gull-wing lines 32 on the substrate partially overlap with the orthographic projections of the first gull-wing lines electrically connected to the first line segments on the substrate, the line distance from the fanout lines 2 electrically connected to the gull-wing lines 3 to the output terminals 4 may be prolonged through the first line segments 321, the shortened length of the fanout lines 2 electrically connected to the gull-wing lines 3 may be offset to a certain extent, the resistance compatibility between different lines may be improved, and thus the stability of signal transmission can be improved. In practical application, the line length needing to be offset varies, and the actual length of the second line segments 322 may be controlled by setting the first line segments 321 and the second line segments 322 to be perpendicular, or setting the angle between the first line segments 321 and the second line segments 322 as an obtuse angle according to actual product requirements, thereby improving the resistance compatibility between the lines. In addition, in order to optimize the arrangement of lines in bonding regions B of different display products and improve space utilization, the angle between the first line segments 321 and the second line segments 322 may be adjusted.

Figure 34:
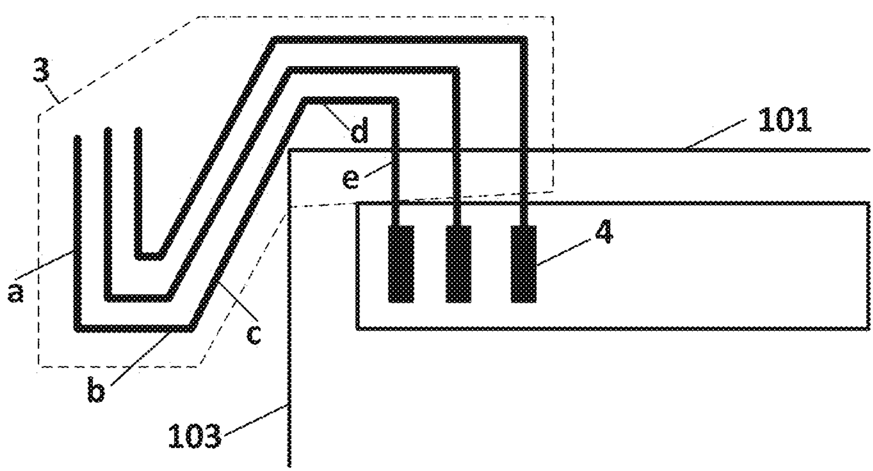

In an exemplary embodiment, referring to FIG. 34, the gull-wing lines 3 are disposed in the same layer.

The gull-wing lines 3 disposed in the same layer each includes a first line segment a, a second line segment b, a third line segment c, a fourth line segment d, and a fifth line segment e that are connected in sequence, where the first line segment a and the second line segment b are located in the bonding region B, the third line segment c extends from the bonding region B to the fanout region F, and the fourth line segment d and the fifth line segment e are located in the fanout region F; and the first line segment a is electrically connected to the fanout lines 2, and the fifth line segment e is electrically connected to the output terminals 4. An angle between an extension line of the second line segment b and an extension line of the third line segment c is a right angle, and an angle between the extension line of the third line segment c and an extension line of the fourth line segment d is a right angle. Or, the angle between the extension line of the second line segment b and the extension line of the third line segment c is an obtuse angle, the angle between the extension line of the third line segment c and the extension line of the fourth line segment d is an obtuse angle, and the two obtuse angles are the same.

The specific angle of the above obtuse angle is not limited here, but can be determined according to the actual situation.

Figure 35:
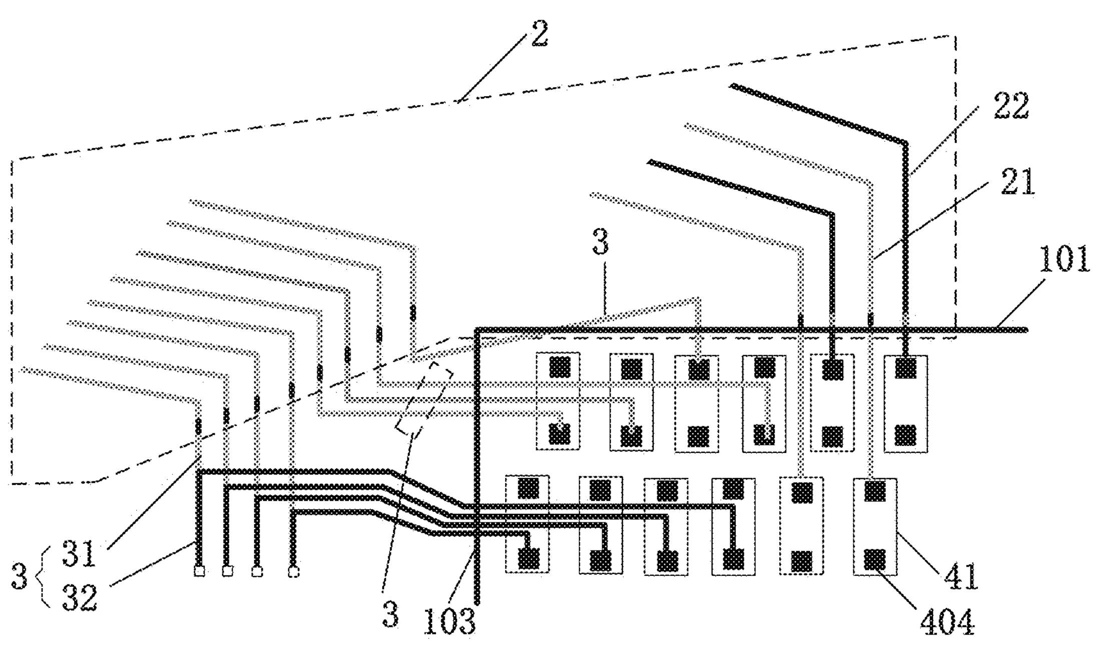

In an exemplary embodiment, the touch fanout lines 22 extend from the fanout region F to the region where the first side edge 101 is located, and are electrically connected to the receiving terminals 41, and the receiving terminals 41 are electrically connected to the output terminals 4; and part of the display fanout lines 21 are electrically connected to the receiving terminals 41 via the gull-wing lines 3, and the gull-wing lines 3 pass through the regions where the two sides (the third side edges 103) of the driver chip are located. The display fanout lines 21 electrically connected to the receiving terminals 41 via the gull-wing lines 3 may be divided into three parts. The first part of display fanout lines 21 are electrically connected to the receiving terminals 41 via the gull-wing lines 3, and the gull-wing lines 3 pass through the region where the first side edge 101 is located. Referring to FIG. 35, the gull-wing lines 3 passing through the region where the first side edge 101 is located may be divided into three segments. The angle between a first segment and a second segment is equal to the angle between the second segment and a third segment.

Figure 36:
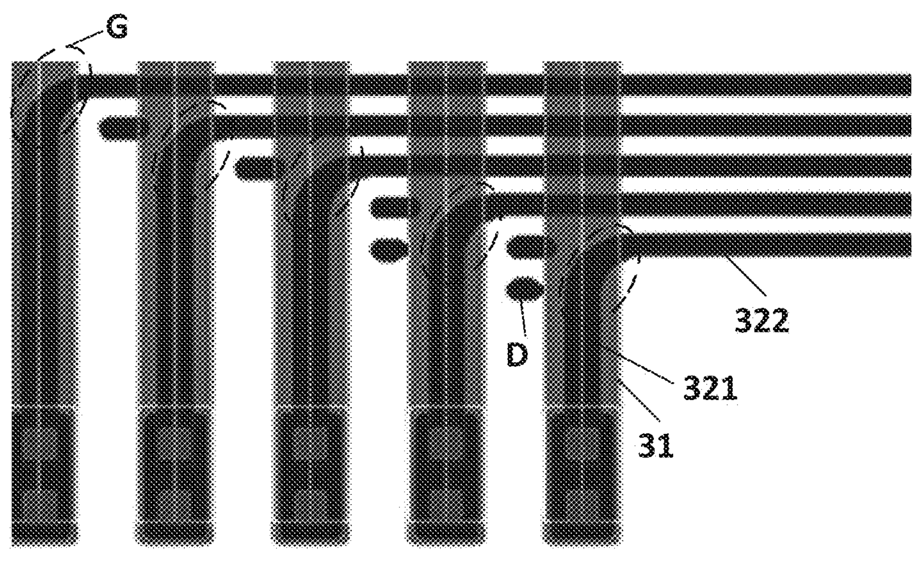

In some embodiments of the present application, as shown in FIG. 8 and FIG. 36, the second gull-wing lines 32 each includes a first line segment 321, a second line segment 322, and a third line segment 323 connected in sequence.

First corners G are disposed between the first line segment 321 and the second line segment 322, and second corners (not shown in FIG. 36) are disposed between the second line segment 322 and the third line segment 323.

At least part of the corners (including the first corners and the second corners) are rounded corners.

It should be noted that FIG. 36 is a partially enlarged view of regions where the first line segments 321 and the second line segments 322 are located in FIG. 8. FIG. 36 is a schematic structural diagram of the first corners, and the structure of the second corners is similar to that of the first corners, which will thus not be repeated.

In an exemplary embodiment, at least part of the corners being rounded corners indicates that: part of the first corners are rounded corners; or, all the first corners are rounded corners; or, part of the second corners are rounded corners; or, all the second corners are rounded corners; or, the first corners and the second corners are both rounded corners.

Certainly, part of the corners may also be right angles, which may be determined according to the actual situation.

In some embodiments of the present application, referring to FIG. 36, at least one island pattern D is disposed between every two adjacent first corners G, and the island patterns D between every two adjacent first corners G are not connected; and/or at least one island pattern is disposed between every two adjacent second corners, and the island patterns between every two adjacent second corners are not connected.

In an exemplary embodiment, the island patterns indicate that the figures are not connected to any other structure around a region where the figures are located, and the figures are disposed independently. In practical application, because the island patterns are prepared with the same material as the source-drain metal layer, or with the same material as the gate layer, the island patterns may be electrically conductive, but are not electrically connected to any other lines or signal lines.

In an exemplary embodiment, at least one island pattern is disposed between every two adjacent first corners, and the island patterns between every two adjacent first corners are not connected; or, at least one island pattern is disposed between every two adjacent second corners, and the island patterns between every two adjacent second corners are not connected. Or, at least one island pattern is disposed between every two adjacent first corners, and the island patterns between every two adjacent first corners are not connected; and at least one island pattern is disposed between every two adjacent second corners, and the island patterns between every two adjacent second corners are not connected.

The number of the island patterns D between every two adjacent first corners is not limited herein.

Exemplarily, the number of the island patterns D between every two adjacent first corners is not identical, or, the number of the island patterns D between every two adjacent first corners is identical. In FIG. 36, the number of the island patterns D between every two adjacent first corners is not identical. It should be noted that the number of the island patterns D between every two adjacent first corners being not identical indicates that: for part of the first corners, the number of the island patterns D between every two adjacent first corners is the same, and for another part of the first corners, the number of the island patterns D between every two adjacent first corners is different.

The number of the island patterns D between every two adjacent second corners is not limited herein. Exemplarily, the number of the island patterns D between every two adjacent first corners is not identical, or, the number of the island patterns D between every two adjacent first corners is identical.

In addition, the number of the island patterns D between every two adjacent first corners may be the same as the number of the island patterns D between every two adjacent second corners, or the number of the island patterns D between every two adjacent first corners may be different from the number of the island patterns D between every two adjacent second corners.

The specific shape and size of the island patterns D between every two adjacent first corners are not limited herein. The specific shape and size of the island patterns D between every two adjacent second corners are not limited herein.

In practical application, the shape of the island patterns D between every two adjacent first corners may be set to be the same as the shape of the island patterns D between every two adjacent second corners in order to simplify the design.

Exemplarily, shapes of projections of the island patterns D between every two adjacent first corners on the substrate are arcs, polygons, or a combination of arcs and polygons.

The arcs may include sectors, semicircles, semi-ellipses, circles, and ellipses. The polygons may include triangles, quadrilaterals, pentagons, or hexagons.

Exemplarily, shapes of projections of the island patterns D between every two adjacent second corners on the substrate are the same as the shapes of the island patterns D between every two adjacent first corners on the substrate.

In an exemplary embodiment, referring to FIG. 36, the island patterns D between every two adjacent first corners may be disposed in the same layer as the second gull-wing lines 32 (including the first line segments 321, the second line segments 322, and the third line segments 323), and the second gull-wing lines 32 and the first gull-wing lines 31 are located in different layers.

In an exemplary embodiment, the island patterns may be located in the same layer as the gate layer; or, the island patterns may be located in the same layer as the source-drain metal layer, which may be determined according to the actual situation and is not limited herein.

In practical application, the island patterns D and the second gull-wing lines 32 may be disconnected.

In an exemplary embodiment, referring to FIG. 36, not all the island patterns D between every two adjacent first corners have an overlapping region with the first gull-wing lines 31 in the direction perpendicular to the substrate.

Exemplarily, referring to FIG. 36, the outline of the orthographic projections of the first line segments 321 on the substrate is located within the outline of the orthographic projections of the first gull-wing lines 31 on the substrate. In this case, the orthographic projections of at least part of the island patterns D between every two adjacent first corners on the substrate may partially overlap with the orthographic projections of the first gull-wing lines 31 on the substrate.

Exemplarily, the outline of the orthographic projections of the first line segments 321 on the substrate overlaps with the outline of the orthographic projections of the first gull-wing lines 31 on the substrate. In this case, the orthographic projections of at least part of the island patterns D between every two adjacent first corners on the substrate do not overlap with the orthographic projections of the first gull-wing lines 31 on the substrate.

In practical application, by disposing the island patterns between the adjacent first corners, and/or, by disposing the island patterns between the adjacent second corners, the stability of a preparation process may be improved, and the line width uniformity of lines near the first corners and the second corners may be improved.

Figure 9:
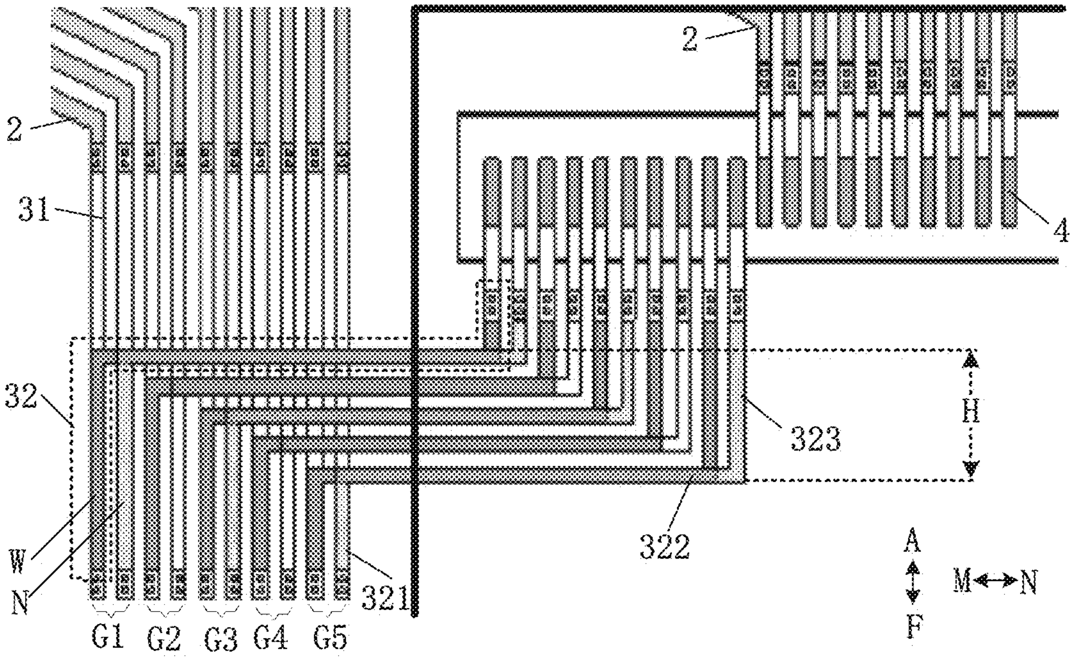
FIG. 9 is a schematic structural diagram of a bonding region of a display panel shown in FIG. 10.

In some embodiments of the present application, referring to FIG. 9, part of the second gull-wing lines 32 are located in the same layer, another part of the second gull-wing lines 32 are located in the same layer, and the two parts of second gull-wing lines 32 are located in different layers.

Exemplarily, referring to FIG. 9, every two first line segments 321 fall into a set in the third direction MN. Each first line segment line set (G1, G2, G3, G4, or G5) includes an outer first line segment W and an inner first line segment N arranged in the third direction MN. For each first line segment line set, orthographic projections of second line segments 322 electrically connected to the outer first line segment W on the substrate overlap with orthographic projections of second line segments 322 electrically connected to the inner first line segment N on the substrate.

In an exemplary embodiment, the gull-wing lines 3 are disposed in three conductive film layers, respectively. Specifically, referring to FIG. 9, the first gull-wing lines 31 and the second gull-wing lines 32 are located in different layers, and second gull-wing lines 32 corresponding to the outer first line segment W and the inner first line segment N in each first line segment line set respectively are located in different layers.

In an exemplary embodiment, the contact resistance between lap metals and the occupied design space need to be balanced when the lines located in different layers communicate through via holes. The greater the number of the via holes, the lower the contact resistance between two layers of lap metals, but the more the occupied space. Taking into account the resistance and space requirements, the number of lap via holes is usually two, and the contact resistance is around 1.5Ω.

Exemplarily, the first gull-wing lines 31 are made of the same material as the gate layer (Gate) in the active area AA, that is, the first gull-wing lines 31 are disposed in the same layer as the gate layer; and part of the second gull-wing lines 32 are made of the same material as the source-drain metal layer (SD) in the active area AA, and another part of the second gull-wing lines 32 are made of the same material as a light shield layer (LS) in the active area AA, that is, part of the second gull-wing lines 32 are disposed in the same layer as the source-drain metal layer, and another part of the second gull-wing lines 32 are disposed in the same layer as the light shield layer.

In an exemplary embodiment, molybdenum (Mo) of a single-layer structure, molybdenum/aluminum/molybdenum (Mo/Al/Mo) of a laminated structure, titanium/aluminum/titanium (Ti/Al/Ti) of a laminated structure, molybdenum-niobium/copper (MoNb/Cu) of a double-layer structure, molybdenum-niobium-titanium/copper (MoNiTi/Cu) of a double-layer structure, or titanium/copper (Ti/Cu) of a double-layer structure may be provided as the gate layer.

In an exemplary embodiment, the thickness of the gate layer in the direction perpendicular to the substrate may range from 1000 Å to 10,000 Å. For example, thicknesses of sub-layers of molybdenum/aluminum/molybdenum (Mo/Al/Mo) of the laminated structure are 200 Å/3000 Å/200 Å; thicknesses of sub-layers of titanium/aluminum/titanium (Ti/Al/Ti) of the laminated structure are 150 Å/4000 Å/200 Å; and thicknesses of two sub-layers of molybdenum-niobium-titanium/copper (MoNiTi/Cu) of the double-layer structure are 200 Å/4000 Å.

In an exemplary embodiment, any one of molybdenum (Mo) of a single-layer structure, molybdenum/aluminum/molybdenum (Mo/Al/Mo) of a laminated structure, titanium/aluminum/titanium (Ti/Al/Ti) of a laminated structure, molybdenum-niobium/copper (MoNb/Cu) of a double-layer structure, molybdenum-niobium-titanium/copper (MoNiTi/Cu) of a double-layer structure, or titanium/copper (Ti/Cu) of a double-layer structure may be provided as the source-drain metal layer (SD). The thickness of the source-drain metal layer (SD) in the direction perpendicular to the substrate may range from 1000 Å to 10,000 Å.

In an exemplary embodiment, the light shield layer may be prepared from an aluminum/molybdenum (Al/Mo) metal layer of a double-layer structure, a molybdenum metal layer (Mo) of a single-layer structure, a molybdenum-niobium metal layer (MoNb) of a single-layer structure, or a titanium metal layer of a single-layer structure. The thickness range may be 500 Å–2000 Å.

It should be noted that when the gull-wing lines 3 wind from the right side (the other third side edge 103) and the lower side (the second side edge 102) of the driver chip, the orthographic projections of the second line segments 322 electrically connected to the outer first line segments W on the substrate may also be set to overlap with the orthographic projections of the second line segments 322 electrically connected to the inner first line segments N on the substrate. The drawings according to the present application merely illustrate an example that the gull-wing lines 3 wind from the left side of the driver chip.

In the embodiment of the present application, for each first line segment line set, by setting the orthographic projections of the second line segments 322 electrically connected to the outer first line segments W on the substrate to overlap with the orthographic projections of the second line segments 322 electrically connected to the inner first line segments N on the substrate, the height H of a region occupied by the second gull-wing lines 32 in the first direction AF may be greatly reduced, and thus the design space may be greatly increased. In practical application, by increasing the line width of the second gull-wing lines 32 and the distance between every two adjacent second gull-wing lines 32, the resistance of the second gull-wing lines 32 can be greatly reduced, thus realizing high-frequency charging of the pixel units in the active area AA, improving the charging efficiency of the display panel, shortening the charging time, and reducing the power consumption of the display panel.

In addition, since the height H of the region occupied by the second gull-wing lines 32 in the first direction AF is small, more fanout lines 2 may be set to be externally connected to the output terminals 4 by winding the gull-wing lines 3, thus shortening the length of the fanout lines 2 electrically connected to the gull-wing lines 3, and further reducing the space occupied by the fanout lines 2 in the fanout region F. Further, with the increase of the number of the fanout lines 2 externally connected to the output terminals 4 by winding the gull-wing lines 3, the size of the fanout region F in the direction that the active area AA points to the fanout region F may be further reduced, which is more conducive to the preparation of display panels with narrow bezels.

In some embodiments of the present application, referring to FIG. 3 or FIG. 6, the display panel includes a test unit CT and a plurality of test connection lines 6.

The test unit CT is located on one side, away from the active area AA, of the region where the output terminals 4 are located. The test connection lines 6 are configured to connect the test unit CT and the output terminals 4.

The output terminals 4 electrically connected to the gull-wing lines 3 are directly electrically connected to the test connection lines 6.

Exemplarily, the above test unit CT includes at least one of a display test unit Data CT or a touch test unit VCOM CT. Specifically, the above test unit CT may include the display test unit Data CT; or, the above test unit CT may include the touch test unit VCOM CT; or, the above test unit CT includes both the display test unit Data CT and the touch test unit VCOM CT.

In some embodiments of the present application, part of the output terminals 4 are each connected to both a gull-wing line 3 and a test connection line 6, and orthographic projections of the gull-wing line 3 and the test connection line 6 electrically connected to the same output terminal 4 on the substrate partially overlap.

In this way, the test connection lines 6 and the gull-wing lines 3 may be set to be located in different layers, thus saving the design space between the region where the output terminals 4 are located and the region where the test unit CT is located.

Figure 10:
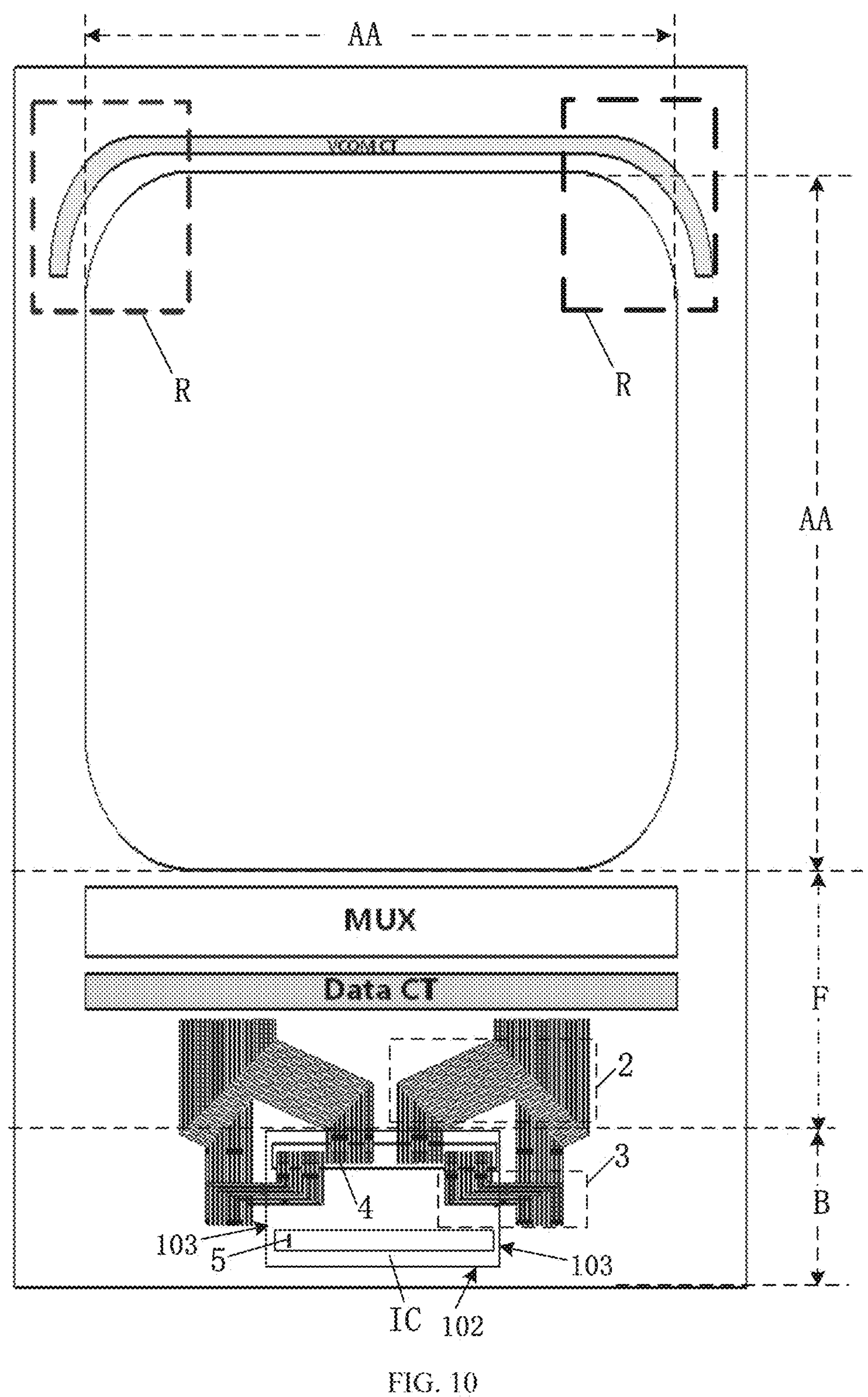

In some embodiments of the present application, referring to FIG. 10, the display panel includes the test unit CT, and the test unit CT is divided into the display test unit Data CT and the touch test unit VCOM CT. At least one of the display test unit Data CT or the touch test unit VCOM CT is located on one side, away from the fanout region F, of the active area AA, and the other one is located in the fanout region F or the bonding region B.

Exemplarily, both the display test unit Data CT and the touch test unit VCOM CT may be disposed on one side, away from the fanout region F, of the active area AA.

Exemplarily, one of the display test unit Data CT and the touch test unit VCOM CT may be located on one side, away from the fanout region F, of the active area AA, and the other one may be located in the fanout region F or the bonding region B.

Specifically, referring to FIG. 10, when the display test unit Data CT or the touch test unit VCOM CT is located in the fanout region F, the display test unit Data CT or the touch test unit VCOM CT may be located in a region between the driver chip IC and a MUX circuit. It should be noted that the MUX circuit is used for electrically connecting the signal lines in the active area AA to the fanout lines 2 in the fanout region F. Reference may be made to the related art for details about the MUX circuit, which will thus not be repeated herein.

When the display test unit Data CT or the touch test unit VCOM CT is located in the bonding region B, the display test unit Data CT or the touch test unit VCOM CT may be located in the region where the driver chip IC is located, and an orthographic projection of the test unit on the substrate overlaps with the orthographic projection of the driver chip IC on the substrate. Or, the display test unit Data CT or the touch test unit VCOM CT may be located in any region in the bonding region B except the region where the driver chip IC is located.

FIG. 10 illustrates an example that the display test unit Data CT is located in the fanout region F, and the touch test unit VCOM CT is located on the side, away from the fanout region F, of the active area AA.

In the embodiment of the present application, due to the fact that at least one of the display test unit Data CT or the touch test unit VCOM CT is located on the side, away from the fanout region F, of the active area AA, the design space of the bonding region B or the fanout region F can be greatly released, space can be provided to increase the line width of the lines in the bonding region B or the fanout region F and increase the distance between every two adjacent lines, and thus the resistance of the lines can be reduced, which is conducive to realizing high-frequency charging of the display panel, improving the charging efficiency, shortening the charging time, and reducing the power consumption.

In some embodiments of the present application, a region of the side, away from the fanout region F, of the active area AA includes a central region and two corner regions R located on two sides of the central region. The display test unit Data CT and the touch test unit VCOM CT include a plurality of test subunits T. Projections of the test subunits T on the substrate are in a shape of a rectangle.

Figure 11:
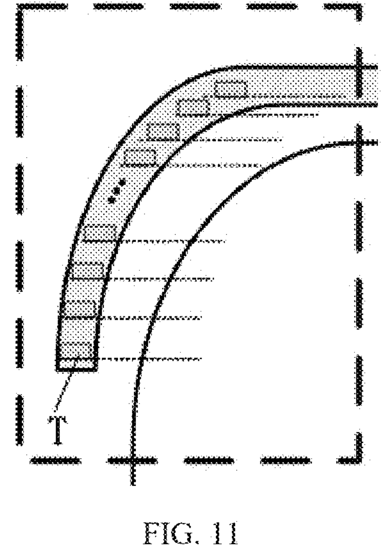
FIG. 11 and FIG. 12 are two schematic structural diagrams of a corner region of a display panel shown in FIG. 10, respectively.
Figure 12:
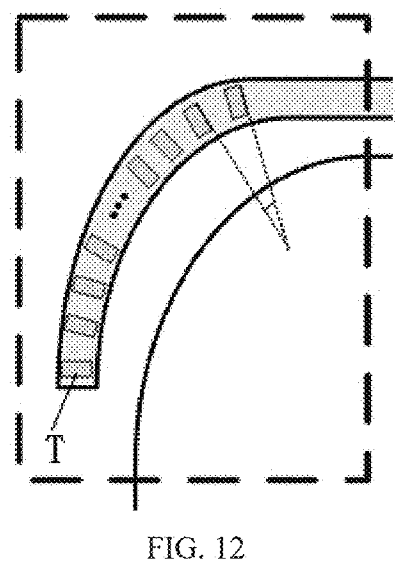

Test subunits T of the corner regions R are disposed around the edge of the active area AA. Referring to FIG. 11, long sides of rectangles of the corner regions R are parallel. Or, referring to FIG. 12, an angle with a preset angle exists between long sides of every two adjacent rectangles of the corner regions R.

Exemplarily, the above preset angle may be an acute angle.

Exemplarily, the angle between the long sides of every two adjacent rectangles is the same.

Exemplarily, the above test subunits T may be test pads; or, the above test subunits T may be switching thin film transistors (STFT); or, part of the test subunits T are test pads, and another part of the test subunits T are switching thin film transistors.

It should be noted that the projections of the test subunits T on the substrate are in the shape of the rectangle, where the rectangle may be a standard rectangle, or may be a rounded rectangle.

In the embodiment of the present application, by setting the long sides of the projections of the test subunits T in the corner regions R on the substrate to be parallel, the design difficulty, fabrication difficulty, and cost may be reduced.

Figure 13:
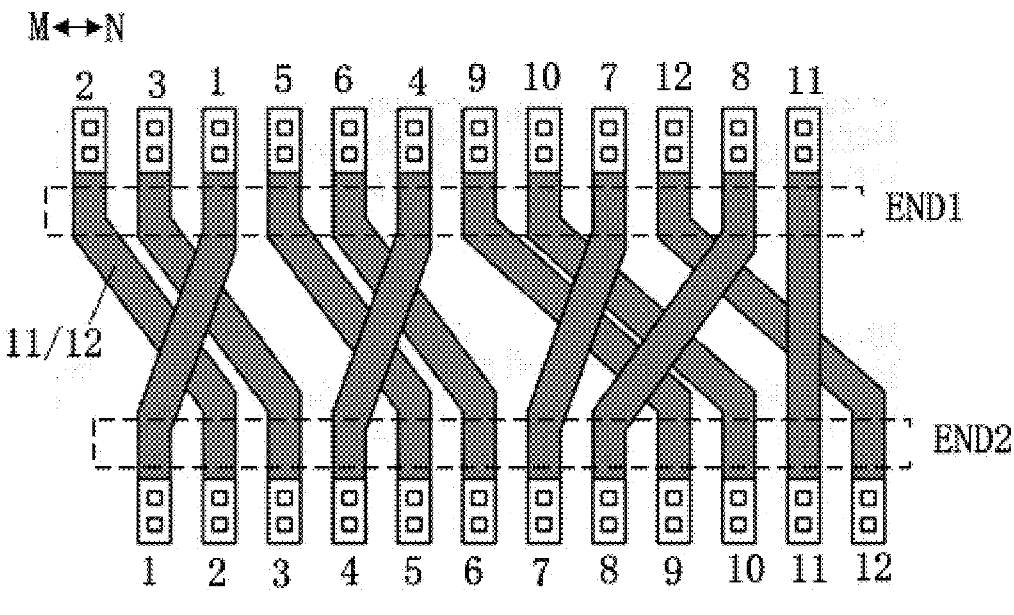
FIG. 13 is a schematic structural diagram of first signal conditioning lines/second signal conditioning lines according to an embodiment of the present application.

In some embodiments of the present application, as shown in FIG. 6 and FIG. 13, the display panel includes a plurality of first signal conditioning lines 11, and the first signal conditioning lines 11 are located between the fanout lines 2 and the gull-wing lines 3.

In the third direction MN, the fanout lines 2 and the gull-wing lines 3 are arranged in different orders. Ends END1, connected to the fanout lines 2, of the first signal conditioning lines 11 are arranged in the same order as the fanout lines 2. Ends END2, connected to the gull-wing lines 3, of the first signal conditioning lines 11 are arranged in the same order as the gull-wing lines 3. The third direction MN intersects the first direction AF.

In practical application, for the fanout lines 2 electrically connected to the gull-wing lines 3, the plurality of fanout lines 2 electrically connected to the gull-wing lines 3 located in the fanout region F are disposed in an order inconsistent with an order of the plurality of gull-wing lines 3 located in the bonding region B, in order to avoid signal transmission misalignment caused by inconsistent positions of the lines, the first signal conditioning lines 11 are disposed between the fanout lines 2 and the gull-wing lines 3, and due to the jumper design of the first signal conditioning lines 11, the fanout lines 2 are electrically connected to the gull-wing lines 3 having consistent signals to be transmitted as the fanout lines.

When the display panel is a display panel of TDDI technology, since part of the fanout lines 2 are display fanout lines and part of the fanout lines 2 are touch fanout lines, misalignment between the order of the fanout lines 2 electrically connected to the gull-wing lines 3 in the fanout region F and the order of the gull-wing lines 3 in the bonding region B is more obvious, and in order to realize a consistent order of signals transmitted by the fanout lines 2 and the gull-wing lines 3 inconsistent in position order, the plurality of first signal conditioning lines 11 are provided, such that the fanout lines 2 are electrically connected to the gull-wing lines 3 having consistent signals to be transmitted as the fanout lines.

Specifically, referring to FIG. 13, the order of the plurality of fanout lines 2 electrically connected to the gull-wing lines 3 is as follows: a second fanout line 2, a third fanout line 2, a first fanout line 2, a fifth fanout line 2, a sixth fanout line 2, a fourth fanout line 2, a ninth fanout line 2, etc. The order of the ends, electrically connected to the fanout lines 2, of the gull-wing lines 3 is as follows: a first gull-wing line 3, a second gull-wing line 3, a third gull-wing line 3, etc. Apparently, the position orders of the fanout lines 2 and the gull-wing lines 3 are inconsistent. By disposing the first signal conditioning lines 11 between the fanout lines and the gull-wing lines, the order of the ends END1, electrically connected to the fanout lines 2, of the first signal conditioning lines 11 may be the same as the order of the fanout lines 2, and the order of the ends END2, connected to the gull-wing lines 3, of the first signal conditioning lines 11 may be the same as the order of the gull-wing lines 3. Thus, the fanout lines and the gull-wing lines have inconsistent position orders but consistent order of the signals to be transmitted. It should be noted that the gull-wing lines 3 and the fanout lines 2 are not shown in FIG. 13, and merely the numerical marks indicating the order of the gull-wing lines 3 and the fanout lines 2 are marked at two ends of the first signal conditioning lines 11.

In some embodiments of the present application, referring to FIG. 6 and FIG. 13, second signal conditioning lines 12 are also disposed between the fanout lines 2 that pass through the region where the first side edge 101 is located to be electrically connected to the output terminals 4 and the output terminals 4.

In the third direction MN, the fanout lines 2 and the output terminals 4 are arranged in different orders. Ends END1, connected to the fanout lines 2, of the second signal conditioning lines 12 are arranged in the same order as the fanout lines 2. Ends END2, connected to the output terminals 4, of the second signal conditioning lines 12 are arranged in the same order as the output terminals 4. The third direction MN intersects the first direction AF.

In practical application, for the fanout lines 2 (the part of fanout lines 2 not electrically connected to the gull-wing lines 3) electrically connected to the output terminals 4, the fanout lines 2 electrically connected to the output terminals 4 located in the fanout region F are arranged in an order inconsistent with an order of the output terminals 4 located in the bonding region B, in order to avoid signal transmission misalignment caused by inconsistent positions of the lines and the output terminals 4, the plurality of second signal conditioning lines 12 are disposed between the fanout lines 2 and the output terminals 4, and due to the jumper design of the second signal conditioning lines 12, the fanout lines 2 are electrically connected to the output terminals 4 having consistent signals to be transmitted as the fanout lines.

Specifically, referring to FIG. 13, the order of the plurality of fanout lines 2 electrically connected to the output terminals 4 is as follows: a second fanout line 2, a third fanout line 2, a first fanout line 2, a fifth fanout line 2, a sixth fanout line 2, a fourth fanout line 2, a ninth fanout line 2, etc. The order of the output terminals 4 is as follows: a first output terminal 4, a second output terminal 4, a third output terminal 4, etc. Apparently, the position orders of the fanout lines 2 and the output terminals 4 are inconsistent. By disposing the second signal conditioning lines 12 between the fanout lines and the output terminals, the order of the ends END1, electrically connected to the fanout lines 2, of the second signal conditioning lines 12 may be the same as the order of the fanout lines 2, and the order of the ends END2, connected to the output terminals 4, of the second signal conditioning lines 12 may be the same as the order of the output terminals 4. Thus, the fanout lines 2 and the output terminals 4 have inconsistent position orders but consistent order of the signals to be transmitted. It should be noted that the output terminals 4 and the fanout lines 2 are not shown in FIG. 13, and merely the numerical marks indicating the order of the output terminals 4 and the fanout lines 2 are marked at two ends of the second signal conditioning lines 12.

Figure 14:
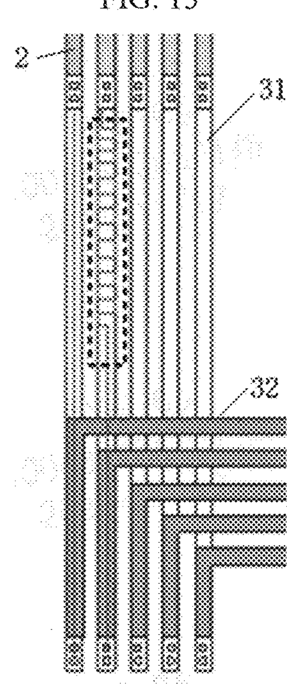
FIG. 14 is a schematic diagram of a serpentine structure of first gull-wing lines according to an embodiment of the present application.

In some embodiments of the present application, referring to FIG. 14, at least part of line segments of the first gull-wing lines 31 are of a serpentine structure.

At least part of line segments indicate that part of the line segments of each first gull-wing line 31 may be of a serpentine structure; or, each first gull-wing line 31 may be entirely of a serpentine structure.

In an exemplary embodiment, the above serpentine structure may be formed by connecting a plurality of curved line segments; or, the above serpentine structure may be formed by connecting a plurality of folded line segments.

In the embodiment of the present application, referring to FIG. 3, since part of the fanout lines 2 in the fanout region F are electrically connected to the output terminals 4 of the driver chip by winding the gull-wing lines 3, the length d4 of part of the line segments, located in the fanout region F, of the fanout lines 2 electrically connected to the gull-wing lines 3 is greatly shortened compared with the length d3 of part of the line segments, located in the fanout region F, of the fanout lines 2 not electrically connected to the gull-wing lines 3, such that the resistance of the fanout lines 2 not electrically connected to the gull-wing lines 3 is much greater than the resistance of the fanout lines 2 electrically connected to the gull-wing lines 3, thereby reducing resistance compatibility between the lines in the display panel, and resulting in unstable signal transmission and even brightness non-uniformity of the display panel.

In the embodiment of the present application, due to the fact that part of the line segments of the first gull-wing lines 31 are set to be of the serpentine structure, the line distance from the fanout lines 2 electrically connected to the gull-wing lines 3 to the output terminals 4 is prolonged, the shortened length of the fanout lines 2 electrically connected to the gull-wing lines 3 can be offset to a certain extent, the resistance compatibility between different lines can be improved, and thus the stability of signal transmission and brightness uniformity of the display panel can be improved.

It should be noted that FIG. 14 merely illustrates an example that part of the line segments of one of the first gull-wing lines 31 are of the serpentine structure.

In some embodiments of the present application, part of the fanout lines 2 are made of first conductive material, another part the fanout lines 2 are made of second conductive material, and resistance of the first conductive material is greater than resistance of the second conductive material.

A part of the fanout lines 2 made of the first conductive material are electrically connected to the first gull-wing lines 31, and part of the fanout lines 2 made of the second conductive material are electrically connected to the first gull-wing lines 31. The first gull-wing lines 31 electrically connected to the fanout lines 2 made of the first conductive material are of the serpentine structure.

In an exemplary embodiment, a part of the fanout lines 2 and the source-drain metal layer in the active area AA are prepared in the same layer and with the same material, for example, the material is aluminum (Al); and another part of the fanout lines 2 and gate lines in the active area AA are prepared in the same layer and with the same material, for example, the material is molybdenum (Mo).

In practical application, by considering the resistance of the metal material and the influence of the line width and thickness of the lines on the resistance, the part of fanout lines 2 prepared in the same layer as the gate lines in the active area AA have greater resistance.

The part of fanout lines 2 prepared in the same layer as the gate lines in the active area AA include fanout lines 2 that are electrically connected to the output terminals 4 via the gull-wing lines 3; and the part of fanout lines 2 prepared in the same layer as the source-drain metal layer in the active area AA also include fanout lines 2 that are electrically connected to the output terminals 4 via the gull-wing lines 3. Since the part of fanout lines 2 prepared in the same layer as the gate lines in the active area AA have greater resistance, and due to the influence of a length difference of the lines on the resistance, the part of fanout lines 2 have a greater resistance difference from other fanout lines 2. As a result, at least part of the line segments of the first gull-wing lines 31 electrically connected to the fanout lines 2 with high resistance are set to be of the serpentine structure, on the one hand, the resistance compatibility between different lines is improved, thus improving the stability of signal transmission and improving the brightness uniformity of the display panel; and on the other hand, the problem of increase in the difficulty of a preparation process caused by setting at least part of the line segments of all the first gull-wing lines 31 to be of a serpentine structure is avoided.

Figure 16:
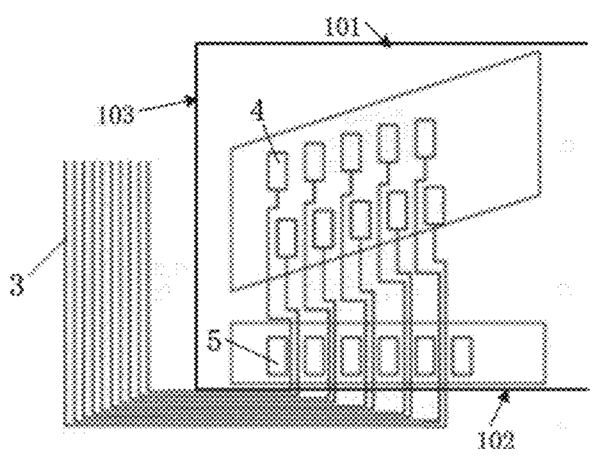
FIG. 16 and FIG. 19 are schematic structural diagrams of two types of gull-wing lines passing through a second side edge of a driver chip according to embodiments of the present application.
Figure 19:
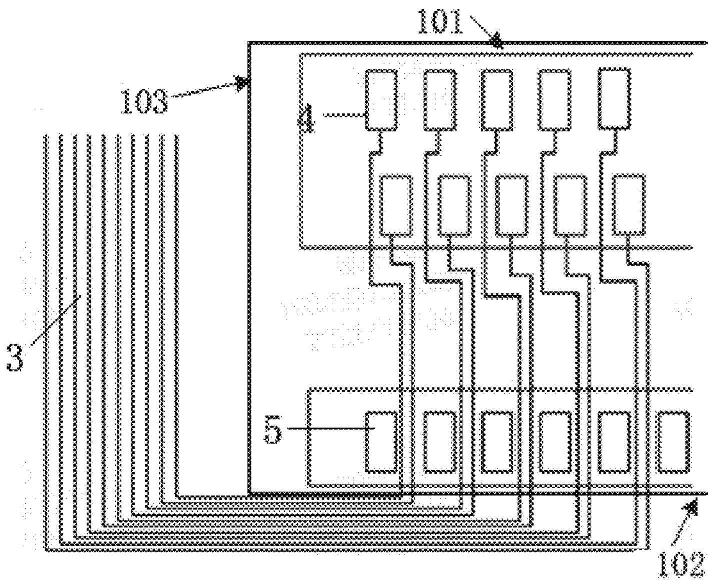

In some embodiments of the present application, referring to FIG. 16 and FIG. 19, the driver chip IC further includes the plurality of input terminals 5, and the input terminals 5 are arranged in an extension direction of the second side edge 102.

The orthographic projections of the gull-wing lines 3 on the substrate of the display panel do not overlap with orthographic projections of the input terminals 5 on the substrate.

In an exemplary embodiment, distances between the output terminals 4 and the second side edge 102 in an extension direction parallel to the third side edge 103 are not identical.

Exemplarily, as shown in FIG. 4 and FIG. 16, a distance between output terminals 4 near the two sides of the driver chip and the input terminals 5 in the extension direction parallel to the third side edge 103 is greater than a distance between output terminals 4 located in the middle position and the input terminals 5 in the extension direction parallel to the third side edge 103.

It should be noted that for the driver chip as shown in FIG. 16, due to the limited space between the region where the output terminals 4 are located and the region where the input terminals 5 are located, the gull-wing lines 3 are usually set to pass through the region where the second side edge 102 of the driver chip is located and then be electrically connected to the output terminals 4.

Figure 17:
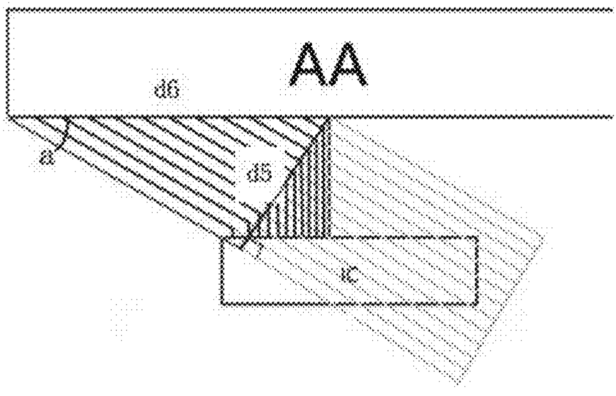
FIG. 17 is a schematic diagram of an arrangement position of fanout lines according to an embodiment of the present application.

In some embodiments of the present application, as shown in FIG. 3 and FIG. 17, the fanout lines 2 include first fanout segments 201 and second fanout segments 202 connected to the first fanout segments, the first fanout segments 201 are electrically connected to the signal lines of the active area AA, and the second fanout segments 202 are electrically connected to the output terminals 4.

A preset angle exists between the second fanout segments 202 and an edge, close to the fanout region F, of the active area AA.

A sine value of the preset angle is equal to a ratio of a width d5 of a region occupied by all the second fanout segments 202 in a direction perpendicular to an extension direction of the second fanout segments to a half d6 of a width of the active area AA in a direction parallel to the first side edge 101.

In practical application, the width d5 of the region occupied by all the second fanout segments 202 in the direction perpendicular to the extension direction of the second fanout segments=the number of the second fanout segments 202*(a line width of the second fanout segments 202+a spacing width between every two adjacent second fanout segments 202), that is, sina=d5/d6, and a=arcsin (d5/d6).

In some embodiments of the present application, referring to FIG. 3, each fanout line 2 has a first inflection point and a second inflection point, and lines connecting the first inflection points of all the fanout lines 2 are first line segments L1, lines connecting the second inflection points of the fanout lines 2 electrically connected to the gull-wing lines 3 are second line segments L2, and lines connecting the second inflection points of the fanout lines 2 not electrically connected to the gull-wing lines 3 are third line segments L3. The first line segments L1 are parallel to the second line segments L2, and the second line segments L2 are parallel to the third line segments L3. In this way, the regularity of the fanout lines 2 in the fanout region F can be improved, and the design difficulty and difficulty of the preparation process of the display panel can be reduced.

An embodiment of the present application provides a display device including the above display panel.

The display device may be a touch display panel, and any product or component with a display function, such as a TV, a digital camera, a mobile phone, and a tablet computer with the touch display panel.

In the display device according to the embodiment of the present application, a plurality of gull-wing lines 3 are disposed in a bonding region B, and by winding the gull-wing lines 3 from the bonding region B (including winding from left and right sides and a lower side of a driver chip), part of fanout lines 2 are electrically connected to output terminals 4 of the driver chip via the gull-wing lines 3, thus utilizing a region, without the driver chip, in the bonding region B, shortening the length of the fanout lines 2 electrically connected to the gull-wing lines 3, and greatly reducing the occupied space of the fanout lines 2 in a fanout region F. In practical application, by increasing the line width of the fanout lines 2 and a distance between every two adjacent fanout lines 2, the resistance of the fanout lines 2 can be greatly reduced, thus realizing high-frequency charging of pixel units in an active area AA, improving the charging efficiency of the display panel, shortening the charging time, and reducing the power consumption of the display panel.

Although merely the specific implementations of the present application have been described above, the scope of the present application is not limited thereto, and any changes or substitutions which can be easily conceived by those skilled in the art within the technical scope disclosed in the present application should be covered by the present application. Accordingly, the scope of the present application should be determined with reference to the appended claims.

The invention claimed is:

1. A display panel, comprising:

an active area;

a fanout region located on one side of the active area;

a bonding region located on one side of the fanout region away from the active area, wherein a driver chip is disposed in the bonding region, the driver chip comprises a first side edge adjacent to the fanout region, a second side edge opposite to the first side edge, and two third side edges connecting the first side edge and the second side edge, the driver chip further comprises a plurality of receiving terminals disposed close to the first side edge;

a plurality of fanout lines located in the fanout region; and a plurality of gull-wing lines located at least in the bonding region;

wherein part of the fanout lines extend from the fanout region to a region where the first side edge is located, and are electrically connected to part of the receiving terminals; another part of the fanout lines are electrically connected to part of the receiving terminals via the gull-wing lines, and the gull-wing lines pass through a region where at least one of the first side edge, the two third side edges or the second side edge is located; and each gull-wing line comprises a first gull-wing line and a second gull-wing line, and the first gull-wing line and the second gull-wing line are located in different layers, wherein an extension direction of the first gull-wing line is the same as an extension direction of each of the two third side edges, and an extension direction of the second gull-wing line is the same as an extension direction of the first side edge.

2. The display panel according to claim 1, wherein when the first gull-wing line is made of a same material as a source-drain metal layer in the active area, the first gull-wing line is made in a same layer as the source-drain metal layer in the active area; and when the second gull-wing line is made of a same material as a gate in the active area, the second gull-wing line is made in a same layer as the gate in the active area; or when the first gull-wing line is made of a same material as the gate in the active area, the first gull-wing line is made in a same layer as the gate in the active area; and when the second gull-wing line is made of a same material as the source-drain metal layer in the active area, the second gull-wing line is made in a same layer as the source-drain metal layer in the active area.

3. The display panel according to claim 2, wherein the second gull-wing line comprises a first line segment extending in a second direction, the second gull-wing line further comprises a second line segment extending along an extension direction of the second side edge, an extension direction of the second direction is the same as the extension direction of the each of the two third side edges, and the first gull-wing line is electrically connected to the first line segment through a via hole.

4. The display panel according to claim 3, wherein the second gull-wing line further comprises a third line segment, the first line segment, the second line segment and the third line segment are connected in sequence, and the third line segment is electrically connected to one of the plurality of receiving terminals.

5. The display panel according to claim 3, wherein an included angle between an extension line of the first line segment and an extension line of the second line segment is a right angle; or an included angle between the extension line of the second line segment and an extension line of the third line segment is an obtuse angle.

6. The display panel according to claim 3, wherein an included angle between an extension line of the second line segment and an extension line of the third line segment is a right angle.

7. The display panel according to claim 3, wherein an orthographic projection of the first line segment on a substrate of the display panel overlaps with an orthographic projection of the first gull-wing line electrically connected to the first line segment on the substrate.

8. The display panel according to claim 3, wherein first corners are disposed between the first line segment and the second line segment, and at least part of the first corners are rounded corners; or the first corners are disposed between the first line segment and the second line segment, at least one island pattern is disposed between every two adjacent first corners, and the island patterns are not connected to each other.

9. The display panel according to claim 1, wherein the first gull-wing line overlaps with the second gull-wing line electrically connected to the first gull-wing line along a direction perpendicular to a substrate.

10. The display panel according to claim 1, wherein the display panel comprises a test unit and a plurality of test connection lines, wherein the test unit is located on a side, away from the active area, of a region where the receiving terminals are located; and the test connection lines are electrically connected to a part of the receiving terminals.

11. The display panel according to claim 10, wherein the receiving terminals electrically connected to the gull-wing lines are electrically connected to the test connection lines.

12. The display panel according to claim 11, wherein in a direction perpendicular to a substrate, the test connection lines overlaps with the gull-wing lines.

13. The display panel according to claim 1, wherein part of the gull-wing lines pass through the region where the first side edge is located, and another part of the gull-wing lines pass through a region where at least one of the two third side edges is located.

14. The display panel according to claim 13, wherein the gull-wing lines passing through the region where the first side edge is located comprise a first line segment, a second line segment, a third line segment, a fourth line segment, and a fifth line segment that are connected in sequence and are disposed in a same layer.

15. The display panel according to claim 14, wherein an extension direction of the first line segment is the same as the extension direction of each of the two third side edges, an extension direction of the third line segment is the same as the extension direction of each of the two third side edges, an extension direction of the fifth line segment is the same as the extension direction of each of the two third side edges, an extension direction of the second line segment is the same as the extension direction of the first side edge, and an extension direction of the fourth line segment is the same as the extension direction of the first side edge.

16. The display panel according to claim 13, wherein the gull-wing lines passing through the region where at least one of the two third side edges is located comprise a first line segment, a second line segment and a third line segment that are connected in sequence and are disposed in a same layer, an extension direction of the first line segment is the same as the extension direction of each of the two third side edges, and an extension direction of the second line segment is the same as the extension direction of the first side edge.

17. The display panel according to claim 16, wherein in a direction perpendicular to a substrate, the second line segment overlaps with the first gull-wing line.

18. The display panel according to claim 13, wherein receiving terminals electrically connected to the gull-wing lines passing through the region where the first side edge is located, receiving terminals electrically connected to the gull-wing lines passing through the regions where at least one of the two third side edges are located, and receiving terminals electrically connected to the fanout lines extending from the fanout region to the region where the first side edge is located are arranged in sequence in the extension direction of the first side edge.

19. A display device, comprising the display panel according to claim 1.

* * * * *